United States Patent
Yoon et al.

(10) Patent No.: US 11,456,048 B2
(45) Date of Patent: Sep. 27, 2022

(54) METHOD OF PREDICTING REMAINING LIFETIME OF NONVOLATILE MEMORY DEVICE AND STORAGE DEVICE PERFORMING THE SAME

(71) Applicant: Samsung Electronics Co., Ltd., Suwon-si (KR)

(72) Inventors: Jongyoon Yoon, Yongin-si (KR); Hyeonjong Song, Suwon-si (KR); Seonghyeog Choi, Hwaseong-si (KR); Hongrak Son, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/392,781

(22) Filed: Aug. 3, 2021

(65) Prior Publication Data
US 2022/0199185 A1    Jun. 23, 2022

(30) Foreign Application Priority Data
Dec. 23, 2020 (KR) .......... 10-2020-0181856

(51) Int. Cl.
  *G11C 29/42* (2006.01)
  *G11C 29/18* (2006.01)
  *G11C 16/34* (2006.01)

(52) U.S. Cl.
  CPC .......... *G11C 29/42* (2013.01); *G11C 16/3404* (2013.01); *G11C 16/3495* (2013.01); *G11C 29/18* (2013.01); *G11C 2029/1802* (2013.01)

(58) Field of Classification Search
  CPC . G11C 13/0005; G11C 29/42; G11C 16/3404; G11C 16/3495; G11C 29/18
  See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 10,157,013 B2 | 12/2018 | Perlmutter et al. | |
| 10,223,029 B2 | 3/2019 | Gorobets et al. | |
| 10,395,754 B2 * | 8/2019 | Maffeis | H03M 13/3723 |
| 10,691,346 B2 * | 6/2020 | Han | G06F 3/0634 |

(Continued)

*Primary Examiner* — Han Yang
(74) *Attorney, Agent, or Firm* — Harness, Dickey & Pierce, P.L.C.

(57) ABSTRACT

In a method of predicting a remaining lifetime of the nonvolatile memory device, a read sequence is performed. The read sequence includes a plurality of read operations, and at least one of the plurality of read operations is sequentially performed until read data stored in the nonvolatile memory device is successfully retrieved. Sequence class and error correction code (ECC) decoding information are generated. A life stage of the nonvolatile memory device is determined based on at least one of the sequence class and the ECC decoding information. When it is determined that the nonvolatile memory device corresponds to a first life stage, a coarse prediction on the remaining lifetime of the nonvolatile memory device is performed. When it is determined that the nonvolatile memory device corresponds to a second life stage after the first life stage, a fine prediction on the remaining lifetime of the nonvolatile memory device is performed.

20 Claims, 21 Drawing Sheets

(56) References Cited

U.S. PATENT DOCUMENTS

| | | |
|---|---|---|
| 10,700,703 B2 | 6/2020 | Khan et al. |
| 10,726,930 B2 | 7/2020 | Sarkar et al. |
| 10,891,189 B2 * | 1/2021 | Wang .................... G11C 29/52 |
| 2011/0233648 A1 | 9/2011 | Seol et al. |
| 2018/0174658 A1 | 6/2018 | Kikuchi |
| 2020/0004435 A1 | 1/2020 | Borlick et al. |
| 2020/0133489 A1 | 4/2020 | Martin et al. |
| 2020/0159613 A1 | 5/2020 | Otterstedt |

* cited by examiner

| SEQUENCE CLASS(INDEX VALUE) | READ OPERATION |
|---|---|
| SC1(1) | FIRST READ OPERATION |
| SC2(2) | SECOND READ OPERATION |
| SC3(3) | THIRD READ OPERATION |
| ⋮ | ⋮ |
| SCX(X) | X-TH READ OPERATION |

FIG. 13

| SEQUENCE CLASS(INDEX VALUE) | READ OPERATION |
|---|---|
| SC1(1) | FIRST READ OPERATION |
| SC1R(2) | FIRST RECOVERY READ OPERATION |
| SC2(3) | SECOND READ OPERATION |
| SC2R(4) | SECOND RECOVERY READ OPERATION |
| SC3(5) | THIRD READ OPERATION |
| SC3R(6) | THIRD RECOVERY READ OPERATION |
| ⋮ | ⋮ |
| SCX(2X−1) | X-TH READ OPERATION |
| SCXR(2X) | X-TH RECOVERY READ OPERATION |

| ECC DECODING | NUMBER OF ERROR BITS |
|---|---|
| ECCD1 | E1 |
| ECCD2 | E2 |
| ECCD3 | E3 |
| ECCD4 | E4 |
| ECCD5 | E5 |
| ECCD6 | E6 |

METHOD OF PREDICTING REMAINING LIFETIME OF NONVOLATILE MEMORY DEVICE AND STORAGE DEVICE PERFORMING THE SAME

CROSS-REFERENCE TO RELATED APPLICATION

This U.S. non-provisional application claims priority under 35 USC § 119 to Korean Patent Application No. 10-2020-0181856, filed on Dec. 23, 2020, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a method of predicting a remaining lifetime of a nonvolatile memory device and a storage device performing the method.

2. Discussion of the Related Art

Semiconductor memory devices may be classified into volatile memory devices and nonvolatile memory devices according to whether stored data is lost when a power supply is interrupted. The volatile memory devices read and write faster, however, stored data is lost when the power is not supplied. On the other hand, the nonvolatile memory devices preserve the stored data even when the power is not supplied. Therefore, the nonvolatile memory devices are used to store data to be preserved regardless of whether the power is supplied or not. As the nonvolatile memory devices are widely used, various methods for predicting remaining lifetime of the nonvolatile memory devices are studied.

SUMMARY

At least some example embodiments of the inventive concepts may provide a method and apparatus for a nonvolatile memory device, capable of increasing a speed of prediction and improving an accuracy of the prediction, on a remaining lifetime of the nonvolatile memory device.

According to at least some example embodiments of the inventive concepts, a method of predicting a remaining lifetime of a nonvolatile memory device, the method includes performing one or more read operations, iteratively, until read data stored in the nonvolatile memory device is successfully retrieved; generating a sequence class and error correction code (ECC) decoding information, the sequence class corresponding to a success read operation, the success read operation being a read operation, from among the one or more read operations, based upon which the read data is successfully retrieved; determining a life stage of the nonvolatile memory device based on at least one of the sequence class and the ECC decoding information; in response to determining that the nonvolatile memory device corresponds to a first life stage, performing a coarse prediction on the remaining lifetime of the nonvolatile memory device based on the sequence class and the ECC decoding information; and in response to determining that the nonvolatile memory device corresponds to a second life stage after the first life stage, performing a fine prediction on the remaining lifetime of the nonvolatile memory device based on the sequence class, the ECC decoding information and threshold voltage information of the nonvolatile memory device.

According to at least some example embodiments of the inventive concepts, a storage device includes a nonvolatile memory device; and a storage controller processor configured to control the nonvolatile memory device, wherein the storage controller processor is further configured to perform one or more read operations, iteratively, until read data stored in the nonvolatile memory device is successfully retrieved, generate a sequence class and error correction code (ECC) decoding information, the sequence class corresponding to a success read operation, the success read operation being a read operation, from among the one or more read operations, based upon which the read data is successfully retrieved, determine a life stage of the nonvolatile memory device based on at least one of the sequence class and the ECC decoding information, in response to determining that the nonvolatile memory device corresponds to a first life stage, perform a coarse prediction on a remaining lifetime of the nonvolatile memory device based on the sequence class and the ECC decoding information, and in response to determining that the nonvolatile memory device corresponds to a second life stage after the first life stage, perform a fine prediction on the remaining lifetime of the nonvolatile memory device based on the sequence class, the ECC decoding information and threshold voltage information of the nonvolatile memory device.

According to at least some example embodiments of the inventive concepts, a method of predicting a remaining lifetime of a nonvolatile memory device includes performing one or more read operations, iteratively, until read data stored in the nonvolatile memory device is successfully retrieved; generating a sequence class and error correction code (ECC) decoding information, the sequence class corresponding to a success read operation, the success read operation being a read operation, from among the one or more read operations, based upon which the read data is successfully retrieved; determining a life stage of the nonvolatile memory device based on at least one of the sequence class and the ECC decoding information; in response to determining that the nonvolatile memory device corresponds to a first life stage, performing a coarse prediction on the remaining lifetime of the nonvolatile memory device based on the sequence class and the ECC decoding information; and in response to determining that the nonvolatile memory device corresponds to a second life stage after the first life stage, performing a fine prediction on the remaining lifetime of the nonvolatile memory device based on the sequence class, the ECC decoding information and threshold voltage information of the nonvolatile memory device, wherein the sequence class includes an index value corresponding to the success read operation, wherein determining the life stage of the nonvolatile memory device includes, in response to determining that the index value is less than or equal to a reference index value, determining that the nonvolatile memory device corresponds to the first life stage, wherein performing the coarse prediction includes, performing the coarse prediction using the sequence class and the ECC decoding information as input data of an artificial intelligence (AI) model; and predicting the remaining lifetime of the nonvolatile memory device using the sequence class, the ECC decoding information as the input data of the AI model, and wherein the remaining lifetime of the nonvolatile memory device includes at least one of remaining program/erase (P/E) cycles and a remaining retention time of the nonvolatile memory device.

In the method of predicting a remaining lifetime of a nonvolatile memory device according to at least some example embodiments of the inventive concepts, the remaining lifetime of the nonvolatile memory device may be efficiently determined. When it is determined that the nonvolatile memory device corresponds to a first life stage, a coarse prediction is only performed, and when it is determined that the nonvolatile memory device corresponds to a second life stage after the first life stage, a fine prediction is performed more precisely than the coarse prediction. That is, by adaptively performing different predictions according to life stages of the nonvolatile memory device, a speed and an accuracy of the predictions may be improved.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 11 is a flowchart illustrating an example embodiment of determining a life stage of the nonvolatile memory device of FIG. 1.

FIGS. 12 and 13 are diagrams for describing a process of determining the life stage of the nonvolatile memory device of FIG. 11.

DETAILED DESCRIPTION OF THE EMBODIMENTS

Figure 1:
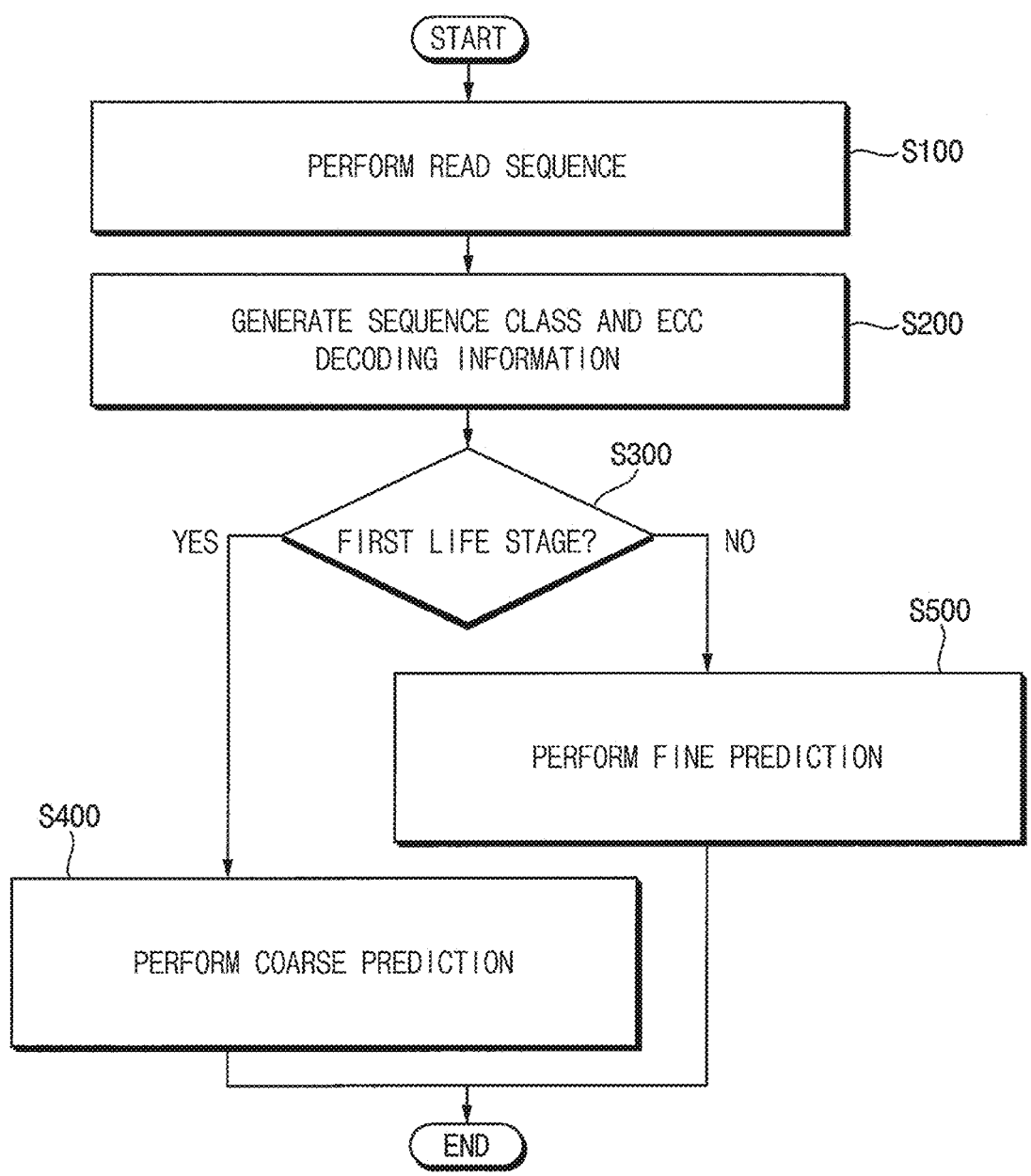
FIG. 1 is a flowchart illustrating a method of predicting a remaining lifetime of a nonvolatile memory device according to at least some example embodiments of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a flowchart illustrating a method of predicting a remaining lifetime of a nonvolatile memory device according to at least some example embodiments of the inventive concepts.

Referring to FIG. 1, a method of predicting a remaining lifetime of a nonvolatile memory device is performed by a memory controller that controls the nonvolatile memory device including a plurality of memory cells. A structure of a memory system including the nonvolatile memory device and the memory controller and a storage device corresponding to the memory system will be described later with reference to FIGS. 2 to 6 and 23.

In the method of predicting the remaining lifetime, a read sequence including a plurality of read operations is performed (S100). For example, as will be discussed in greater detail below with reference to at least FIGS. 7-10 and 12-13, operation S100 may include performing, iteratively, one or more read operations until read data stored in the nonvolatile memory device is successfully retrieved based on one of the read operations. Thus, according to at least some example embodiments of the inventive concepts, a read sequence may include 1-n read operations, where n is a positive integer greater than 1, depending on the number of read operations that occur before the data targeted by the read operations is successfully retrieved. Further, a read operation, from among the one or more iteratively performed read operations, based upon which data stored in the nonvolatile memory device is successfully retrieved may be referred to in the present specification as a success read operation.

According to at least some example embodiments of the inventive concepts, the read data may be stored in a region of the nonvolatile memory device. For example, the read data may be stored in a page including a plurality of memory cells included in the nonvolatile memory device.

According to at least some example embodiments of the inventive concepts, the read sequence may be performed to retrieve the read data stored in the region of the nonvolatile memory device. For example, the read sequence may be performed to retrieve a first read data stored in a first region of the nonvolatile memory device. After the first read data is successfully retrieved, the read sequence may be performed again to retrieve a second read data stored in a second region different from the first region. The read sequence will be described with reference to FIGS. 7 to 10.

A sequence class and error correction code (ECC) decoding information are generated (S200). The sequence class corresponds to a success read operation by which the read data is successfully retrieved among the plurality of read operations.

According to at least some example embodiments of the inventive concepts, the plurality of read operations may correspond to a plurality of sequence classes, respectively. For example, when the read data is successfully retrieved by the success read operation, a single sequence class corresponding to the success read operation may be determined even if two or more read operations are performed.

According to at least some example embodiments of the inventive concepts, the ECC decoding information may be generated corresponding to the plurality of read operations. For example, two or more ECC decoding information may be generated corresponding to each of the plurality of read operations when two or more read operations are performed.

A life stage of the nonvolatile memory device is determined based on at least one of the sequence class and the ECC decoding information (S300).

According to at least some example embodiments of the inventive concepts, the life stage of the nonvolatile memory device may include a first life stage and a second life stage after the first life stage. The first life stage may correspond between a first time point and a second time point. The first time point may be a time point at which the nonvolatile memory device is manufactured, and the second time point may be an arbitrary time point between the first time point and a third time point at which the entire lifetime of the nonvolatile memory device ends. The second life stage may correspond between the second time point and the third time point.

According to at least some example embodiments of the inventive concepts, the life stage of the nonvolatile memory device may be classified into an early stage, a middle stage and a late stage. For example, the first life stage may correspond to the early stage, and the second life stage may correspond to the middle stage and the late stage. In an example of FIG. 1, the life stage of the nonvolatile memory device may be described by classifying into the first life stage and the second life stage. In an example which will be described with reference to FIGS. 16 and 17, the life stage of the nonvolatile memory device may be described by classifying into the early stage, the middle stage and the late stage.

When it is determined that the nonvolatile memory device corresponds to the first life stage (S300: YES), a coarse prediction on the remaining lifetime of the nonvolatile memory device is performed based on the sequence class and the ECC decoding information (S400). When it is determined that the nonvolatile memory device corresponds to the second life stage after the first life stage (S300: NO), a fine prediction on the remaining lifetime of the nonvolatile memory device is performed based on the sequence class, the ECC decoding information and threshold voltage information of the nonvolatile memory device (S500).

According to at least some example embodiments of the inventive concepts, the fine prediction may perform a prediction for the remaining lifetime of the nonvolatile memory device more accurately than the coarse prediction.

According to at least some example embodiments of the inventive concepts, the coarse prediction may be determined based on the sequence class and the ECC decoding information, and the fine prediction may be determined based on not only the sequence class and the ECC information, but also threshold voltage information of the nonvolatile memory device.

According to at least some example embodiments of the inventive concepts, the coarse prediction and the fine prediction may be performed by or using an artificial intelligence (AI) model. The AI model may be learned in advance before performing the steps S100, S200, S300, S400 and S500 according to at least some example embodiments of the inventive concepts.

According to at least some example embodiments of the inventive concepts, the AI model may be one of a neural network based system (e.g., Convolution Neural Network (CNN) and Recurrent Neural Network (RNN)), Support Vector Machine (SVM), linear regression, logistic regression, Naïve Bayes Classification, random forest, decision tree and k-nearest neighbor (KNN) algorithms, but the present disclosure is not limited thereto.

According to at least some example embodiments of the inventive concepts, the sequence class, the ECC information and the threshold voltage information may be input as input data of the AI model. According to at least some example embodiments of the inventive concepts, feature values that are extracted from each of the sequence class, the ECC information and the threshold voltage information may be input as the input data of the AI model.

According to at least some example embodiments of the inventive concepts, the sequence class may include an index value corresponding to the success read operation, and the ECC decoding information may include the number of error bits that is calculated as a result of performing an ECC decoding on the read data. The threshold voltage information may include difference values between a first threshold voltage distribution and a second voltage distribution. The first threshold voltage distribution may be measured immediately after the read data is programmed into memory cells included in the nonvolatile memory device. The second threshold distribution may be measured immediately after the read data is successfully retrieved.

According to at least some example embodiments of the inventive concepts, when a time point at which the life stage of the nonvolatile memory device is determined exceeds a predetermined or, alternatively, desired time from a time point at which the nonvolatile memory device is manufactured, the performing the coarse prediction may be omitted, and only the performing the fine prediction may performed.

In the method of predicting the remaining lifetime of the nonvolatile memory device according example embodiments, the remaining lifetime of the nonvolatile memory device may be efficiently determined by performing the steps S100, S200, S300, S400 and S500.

When it is determined that the nonvolatile memory device corresponds to the first life stage, the coarse prediction may be performed, and when the nonvolatile memory device corresponds to the second life stage after the first life stage, the fine prediction that predicts more accurately than the coarse prediction may be performed. Accordingly, one of the coarse prediction and the fine prediction may be adaptively performed according to the life stage of the nonvolatile memory device, and a speed of the prediction may be increased and an accuracy of the prediction may be improved.

Figure 2:
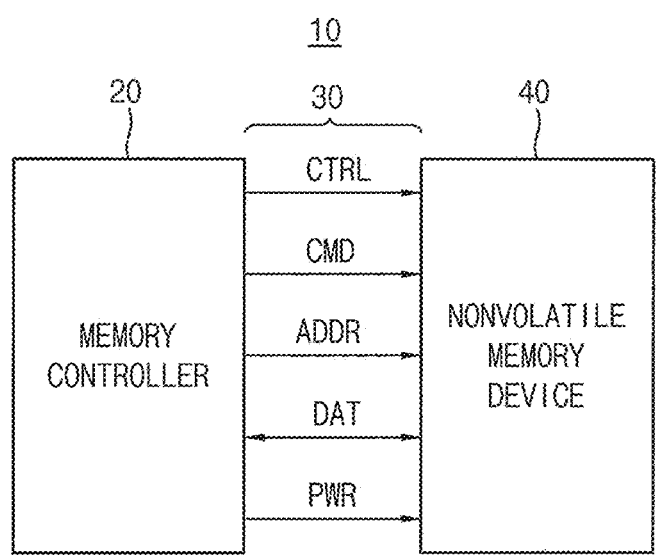
FIG. 2 is a block diagram illustrating a nonvolatile memory device and a storage device including the nonvolatile memory device according to at least some example embodiments of the inventive concepts.

FIG. 2 is a block diagram illustrating a nonvolatile memory device and a storage device including the nonvolatile memory device according to at least some example embodiments of the inventive concepts.

Referring to FIG. 2, a storage device 10 includes a memory controller 20 and a nonvolatile memory device 40. The storage device 10 may further include a plurality of signal lines 30 electrically connecting between the memory controller 20 and the nonvolatile memory device 40.

The memory controller 20 overall controls operations of the nonvolatile memory device 40. For example, the memory controller 20 may write (e.g., program) data to the nonvolatile memory device 40 or read data from the nonvolatile memory device 40 based on a request from a host device (e.g., 1100 in FIG. 23).

The plurality of signal lines 30 may include a control line, a command line, an address line, a data line and a power line.

According to at least some example embodiments of the inventive concepts, the memory controller 20 may transmit a command CMD, an address ADDR and a control signal CTRL to the nonvolatile memory device 40 through the command line, the address line and the control line. The memory controller 20 may transmit and receive a data signal DAT with the nonvolatile memory device 40 through the data line. The memory controller 20 may provide a power voltage PWR to the nonvolatile memory device 40 through the power line. Although now illustrated, the plurality of signal lines 30 may further include a DQS line for transmitting a data strobe signal (e.g., a DQS signal). A portion or all of the plurality of signal lines 30 may be referred to as channels.

Figure 3:
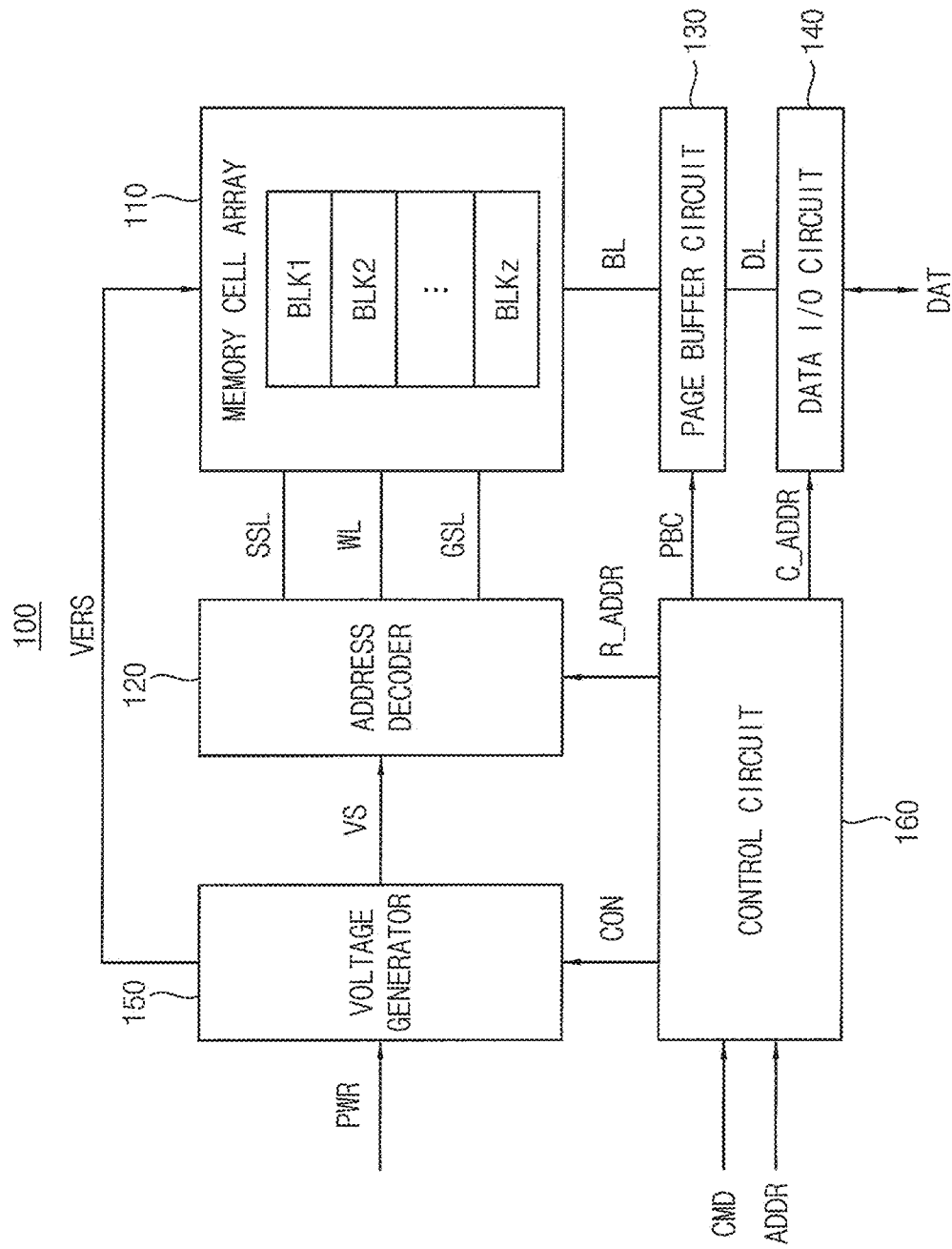
FIG. 3 is a block diagram illustrating a nonvolatile memory device according to at least some example embodiments of the inventive concepts.

FIG. 3 is a block diagram illustrating a nonvolatile memory device according to at least some example embodiments of the inventive concepts.

Referring to FIG. 3, a nonvolatile memory device 100 includes a memory cell array 110, an address decoder 120, a page buffer circuit 130, a data input/output (I/O) circuit 140, a voltage generator 150 and a control circuit 160.

The memory cell array 110 is connected to the address decoder 120 via a plurality of string selection lines SSL, a plurality of wordlines WL and a plurality of ground selection lines GSL. The memory cell array 110 is further connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, . . . , BLKz each of which includes memory cells. In addition, each of the plurality of memory blocks BLK1, BLK2, . . . , BLKz may be divided into a plurality of pages.

In some example embodiments, as will be described with reference to FIGS. 4 and 5, the memory cell array 110 may be a three-dimensional (3D) memory cell array, which is formed on a substrate in a three-dimensional structure (or a vertical structure). In this example, the memory cell array 110 may include a plurality of cell strings (e.g., a plurality of vertical NAND strings) that are vertically oriented such that at least one memory cell is located over another memory cell.

The control circuit 160 receives a command CMD and an address ADDR from an outside (e.g., from a memory controller), and control erasure, programming and read operations of the nonvolatile memory device 100 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 160 may generate control signals CON, which are used for controlling the voltage generator 150, and may generate control signal PBC for controlling the page buffer circuit 130, based on the command CMD, and may generate a row address R_ADDR and a column address C_ADDR based on the address ADDR. The control circuit 160 may provide the row address R_ADDR to the address decoder 120 and may provide the column address C_ADDR to the data I/O circuit 140.

The control circuit 160 may perform the method of predicting remaining lifetime of the nonvolatile memory device according to at least some example embodiments of the inventive concepts described with reference to FIG. 1.

The address decoder 120 may be connected to the memory cell array 110 via the plurality of string selection lines SSL, the plurality of wordlines WL and the plurality of ground selection lines GSL.

For example, in the data erase/write/read operations, the address decoder 120 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate voltages VS that are required for an operation of the nonvolatile memory device 100 based on a power PWR and the control signals CON. The voltages VS may be applied to the plurality of string selection lines SSL, the plurality of wordlines WL and the plurality of ground selection lines GSL via the address decoder 120. In addition, the voltage generator 150 may generate an erase voltage VERS that is required for the data erase operation based on the power PWR and the control signals CON. The erase voltage VERS may be applied to the memory cell array 110 directly or via the bitline BL.

For example, during the erase operation, the voltage generator 150 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 120. In addition, during the erase verification operation, the voltage generator 150 may apply the erase verification voltage VEVFY simultaneously to all wordlines of the memory block or sequentially to the wordlines one by one.

For example, during the program operation, the voltage generator 150 may apply a program voltage to the selected wordline and may apply a program pass voltage to the unselected wordlines via the address decoder 120. In addition, during the program verification operation, the voltage generator 150 may apply a program verification voltage to the selected wordline and may apply a verification pass voltage to the unselected wordlines via the address decoder 120.

In addition, during the normal read operation, the voltage generator 150 may apply a read voltage to the selected wordline and may apply a read pass voltage to the unselected wordlines via the address decoder 120. During the data recover read operation, the voltage generator 150 may apply the read voltage to a wordline adjacent to the selected wordline and may apply a recover read voltage to the selected wordline via the address decoder 120.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. In other words, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from the outside of the nonvolatile memory device 100 to the memory cell array 110 via the page buffer circuit 130 or may provide the data DAT from the memory cell array 110 to the outside of the nonvolatile memory device 100, based on the column address C_ADDR.

Figure 4:
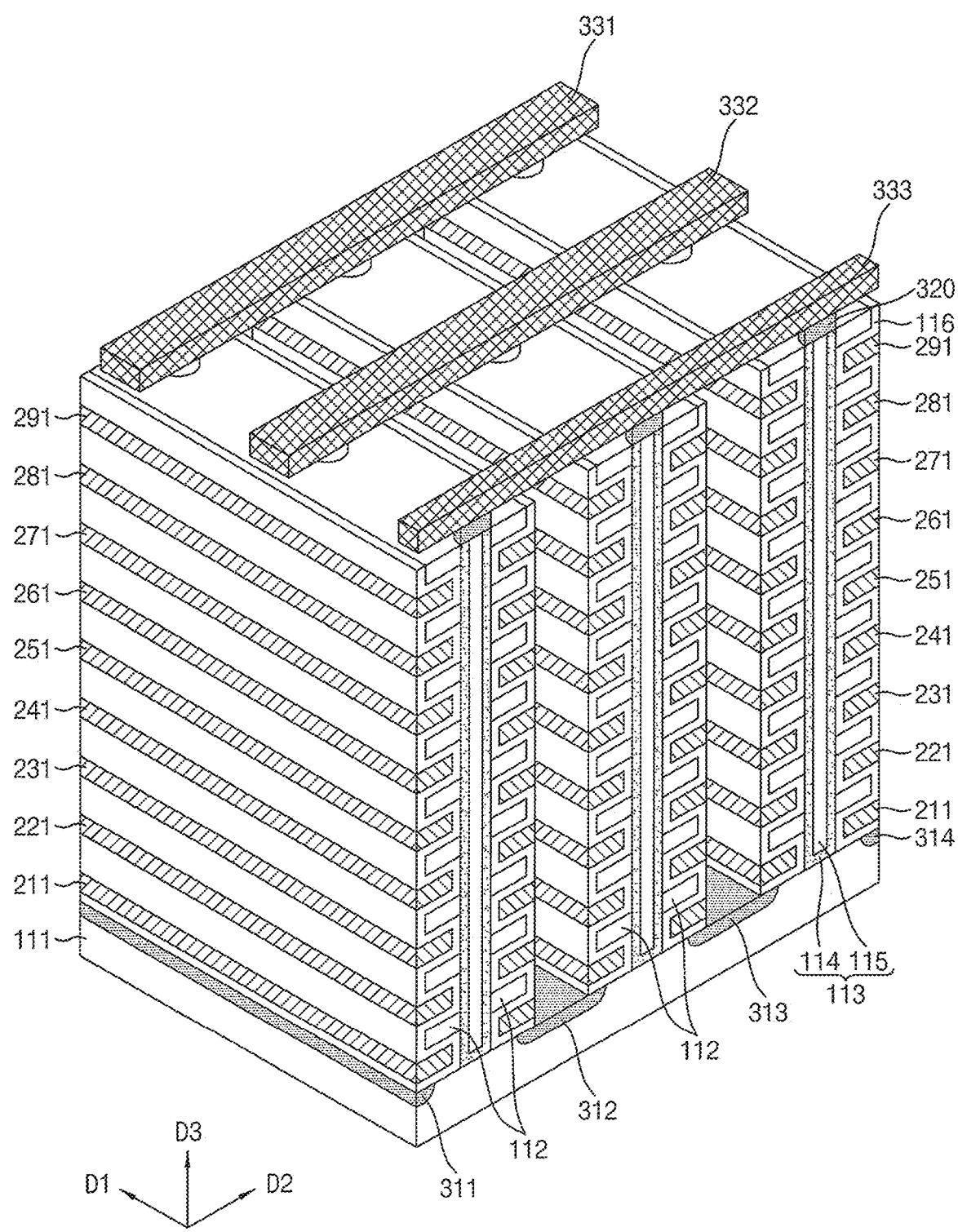
FIG. 4 is a perspective view illustrating an example of a memory block included in a memory cell array of the nonvolatile memory device of FIG. 3.

FIG. 4 is a perspective view of an example of a memory block included in a memory cell array of the nonvolatile memory device of FIG. 3.

Referring to FIG. 4, a memory block BLKi includes a plurality of cell strings (e.g., a plurality of vertical NAND strings) which are formed on a substrate in a three-dimensional structure (or a vertical structure). The memory block BLKi includes structures extending along first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. According to at least one example embodiment of the inventive concepts, the substrate 111 has a p-type well (or a p-type pocket well). However, the conductive type of the substrate 111 is not limited to p-type.

A plurality of doping regions 311, 312, 313 and 314 arranged along the second direction D2 are provided in/on the substrate 111. These plurality of doping regions 311 to 314 may have a second type of charge carrier impurity (e.g., a second conductivity type) different from the first type of the substrate 111. According to at least one example embodiment of inventive concepts, the first to fourth doping regions 311 to 314 may have n-type. However, the conductive type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrate the insulation materials 112 to contact the substrate 111.

In some example embodiments, each pillar 113 may include a plurality of materials. For example, a channel layer 114 of each pillar 113 may include a silicon material having a first conductivity type. For example, the channel layer 114 of each pillar 113 may include a silicon material having the same conductivity type as the substrate 111. According to at least one example embodiment of inventive concepts, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In this example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of the invention the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. And, a plurality of pillars 113 are provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity. For example, the drain regions 320 may include silicon materials doped with an n-type dopant. According to at least one example embodiment of inventive concepts, the drain regions 320 include n-type silicon materials. However, the drain regions 320 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 320 in a corresponding region. The drain regions 320 and the second conductive material 333 extending along the second direction D2 may be connected through each contact plug. Each contact plug may be, for example, a conductive plug formed of a conductive material such as a metal. The second conductive materials 331 to 333 may include metal materials. The second conductive materials 331 to 333 may include conductive materials such as a polysilicon.

In an example of FIG. 4, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 5:
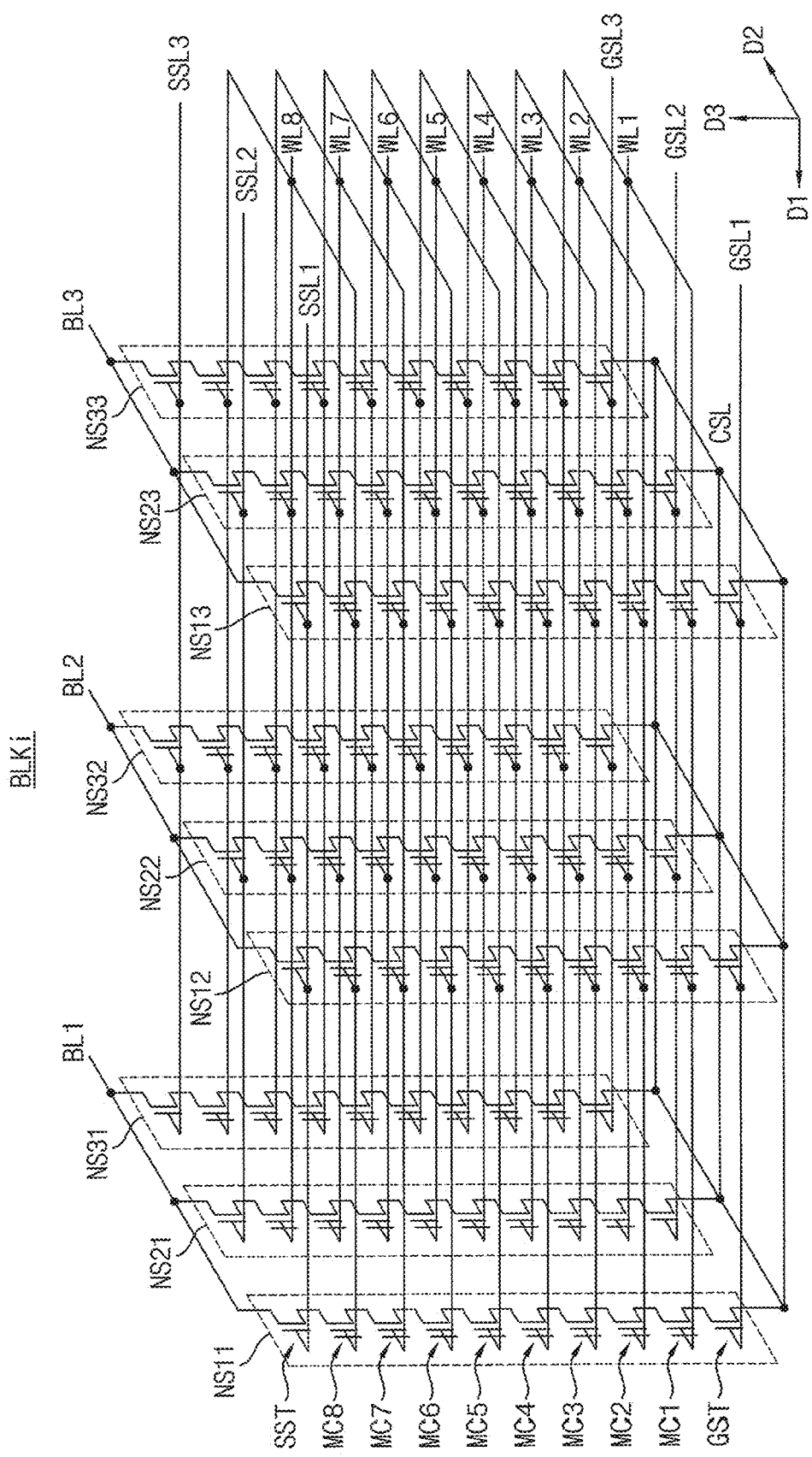
FIG. 5 is a circuit diagram illustrating an equivalent circuit of the memory block of FIG. 4.

FIG. 5 is a circuit diagram illustrating an equivalent circuit of the memory block of FIG. 4.

FIG. 5 is a circuit diagram illustrating an equivalent circuit of a memory block described with reference to FIG. 4.

A memory block BLKi of FIG. 5 may be formed on a substrate in a three-dimensional structure (or a vertical structure). For example, a plurality of NAND strings included in the memory block BLKi may be formed in a direction perpendicular to the substrate.

Referring to FIG. 5, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 4, and the common source line CSL may be formed by interconnecting the first to fourth doping regions 311 to 314 in FIG. 4.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In an example of FIG. 5, some of the string selection transistors SST are connected to the same bitline (e.g., one of BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of cell strings.

In FIG. 5, the memory block BLKi is illustrated to be connected to eight wordlines WL1 to WL8 and three bitlines BL1 to BL3, and each of the NAND strings NS11 to NS33 is illustrated to include eight memory cells MC1 to MC8. However, example embodiments are not limited thereto. In some example embodiments, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to at least some example embodiments of the inventive concepts is described based on a NAND flash memory device, the nonvolatile memory device according to at least some example embodiments of the inventive concepts may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 6:
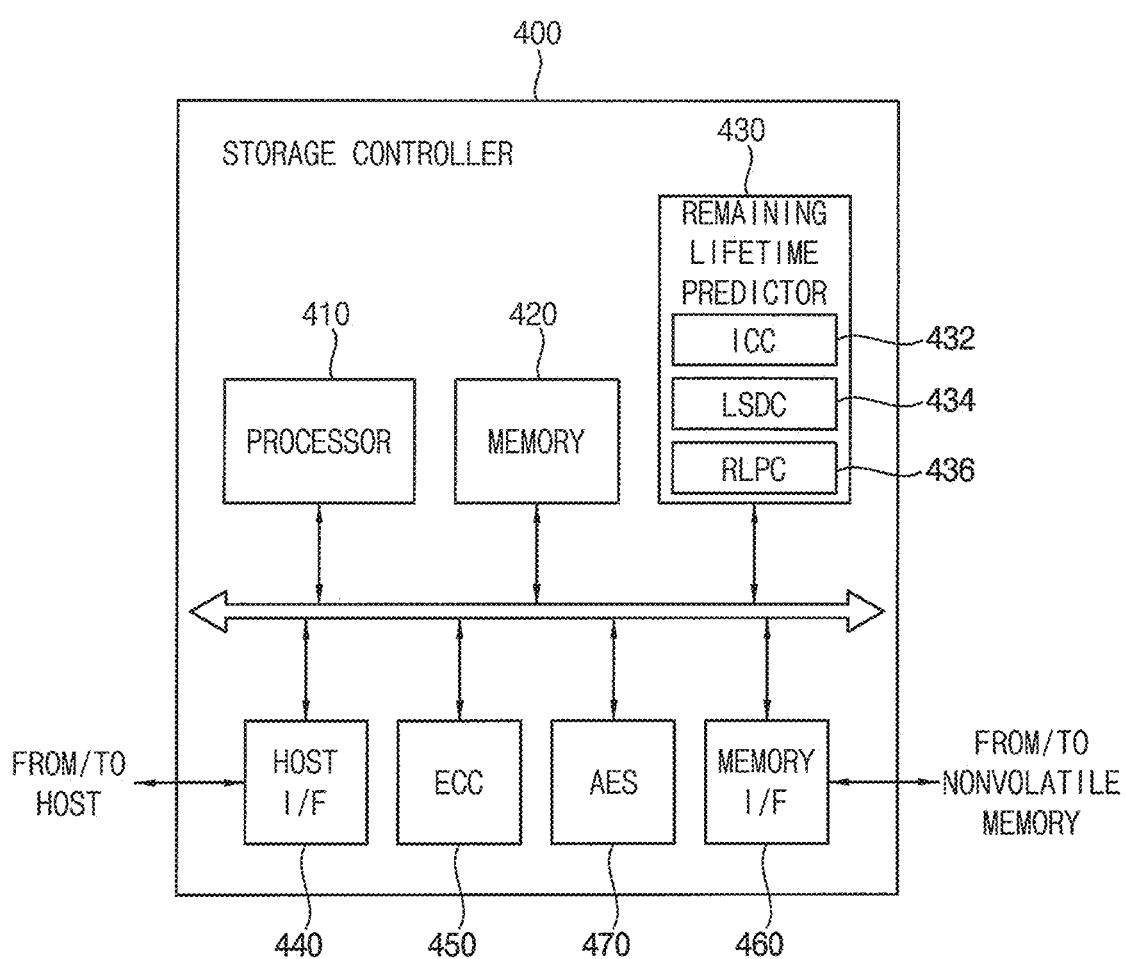
FIG. 6 is a block diagram illustrating a storage controller as an example of memory controller included in the nonvolatile memory device of FIG. 2.

FIG. 6 is a block diagram illustrating a storage controller as an example of memory controller included in the nonvolatile memory device of FIG. 2.

Referring to FIG. 6, a storage controller 400 may include a storage controller processor 410, a memory 420, a remaining lifetime predictor 430, a host interface 440, an ECC engine 450, a memory interface 460 and an Advanced Encryption Standard (AES) engine 470.

According to at least some example embodiments of the inventive concepts, the storage controller processor 410 may be or include hardware including logic circuits; a hardware/software combination executing software; or a combination thereof. For example, the storage controller processor 410 more specifically may include, but is not limited to, one or more of a central processing unit (CPU), a processor core, an arithmetic logic unit (ALU), a digital signal processor, a microcomputer, a field programmable gate array (FPGA), a programmable logic unit, a microprocessor, an application-specific integrated circuit (ASIC), etc. The storage controller processor 410 may be configured, via hardware and/or software (e.g., firmware), to perform and/or control any operation described in the specification as being performed by a storage controller processor, a storage controller, a storage device or an element thereof (e.g., the memory 420, remaining lifetime predictor 430, host interface 440, ECC engine 450, memory interface 460 and/or advanced encryption standard (AES) engine 470). Further, any or all of the remaining lifetime predictor 430, host interface 440, ECC engine 450, memory interface 460 and AES engine 470 of the storage controller 400 may be implemented by one or more circuits or circuitry. Accordingly, the ECC engine 450, memory interface 460, AES engine 470, and storage controller 400 may be referred to in the present specification as the ECC engine circuit 450, memory interface circuit 460, AES engine circuit 470, and storage controller circuit 400, respectively.

The storage controller processor 410 may control operations of the storage controller 400 in response to commands received from host device (e.g., 1100 of FIG. 23) through the host interface 440. For example, the storage controller processor 410 may control the operations of the storage device (e.g., 10 of FIG. 2), and may control the components 420, 430, 440, 450, 460 and 470 by employing firmware for driving the storage device 10. The storage controller processor 410 may additionally perform S100 described above with reference to FIG. 1.

The memory 420 may store instructions and data executed and processed by the storage controller processor 410. For example, the memory 420 may be implemented as a volatile memory such as a dynamic random access memory (DRAM) or a static random access memory (SRAM).

The memory 420 may store various types of data necessary to perform the method of predicting remaining lifetime of the nonvolatile memory device according to at least some example embodiments of the inventive concepts.

The remaining lifetime predictor 430 may include a plurality of components for performing the method of predicting remaining lifetime of the nonvolatile memory device according to at least some example embodiments of the inventive concepts. For example, the remaining lifetime predictor 430 may include an information collection circuit ICC 432, a life stage determination circuit LSDC 434 and a remaining lifetime prediction circuit RLPC 436.

According to at least some example embodiments of the inventive concepts, the storage controller processor 410 may perform a read sequence including a plurality of read operations. For example, one or more read operations may be performed, iteratively, until read data stored in the nonvolatile memory device is successfully retrieved based on one of the read operations.

According to at least some example embodiments of the inventive concepts, the information collection circuit 432 may generate a sequence class and ECC decoding information. The sequence class may correspond to a success read operation by which the read data is successfully retrieved among the plurality of read operations.

According to at least some example embodiments of the inventive concepts, the life stage determination circuit 434 may determine a life stage of the nonvolatile memory device based on at least one of the sequence class and the ECC decoding information.

According to at least some example embodiments of the inventive concepts, the remaining lifetime prediction circuit 436 may perform a coarse prediction on a remaining lifetime of the nonvolatile memory device based on the sequence class and the ECC decoding information when it is determined that the nonvolatile memory device corresponds to a first life stage. The remaining lifetime prediction circuit 436 may perform a fine prediction on the remaining lifetime of the nonvolatile memory device based on the sequence class, the ECC decoding information and threshold voltage information of the nonvolatile memory device when it is determined that the nonvolatile memory device corresponds to a second life stage after the first life stage.

According to at least some example embodiments of the inventive concepts, a portion or all of the remaining lifetime predictor 430 may be implemented in a form of hardware or may be implemented in a form of software (e.g., a program).

The ECC engine 450 for error correction may perform an ECC encoding and an ECC decoding by or using a coded modulation such as Bose-Chaudhuri-Hocquenghem (BCH) code, a Low Density Parity Check (LDPC) code, a Turbo Code, a Reed-Solomon Code, a convolution code, a recursive systematic code (RSC), a trellis-coded modulation (TCM), a block coded modulation (BCM) or other error correction codes.

The host interface 440 may provide a physical connection between host device (e.g., 1100 of FIG. 23) and the storage device 10. That is, the host interface 440 may provide an interfacing with the storage device 10 in response to a bus format of the host device.

According to at least some example embodiments of the inventive concepts, the bus format of the host device may be SCSI or SAS. According to at least some example embodiments of the inventive concepts, the bus format of the host device may be USB, peripheral component interconnect express (PCIe), ATA, PATA, SATA, NVMe, or the like.

The memory interface 460 may exchange data with the nonvolatile memory device 40 in FIG. 2. The memory interface 460 may transmit data to the nonvolatile memory device 40 and may receive data read from the nonvolatile memory device 40. For example, the memory interface 460 may be implemented to comply with a standard convention such as a Toggle or ONFI.

The AES engine 470 may perform at least one of an encryption operation and a decryption operation for data input to the storage controller 400 using a symmetric-key algorithm. Although not illustrated in detail, the AES engine 470 may include an encryption module and a decryption module. According to at least some example embodiments of the inventive concepts, the encryption module and the decryption module may be implemented as separate modules or a single module.

Figure 7:
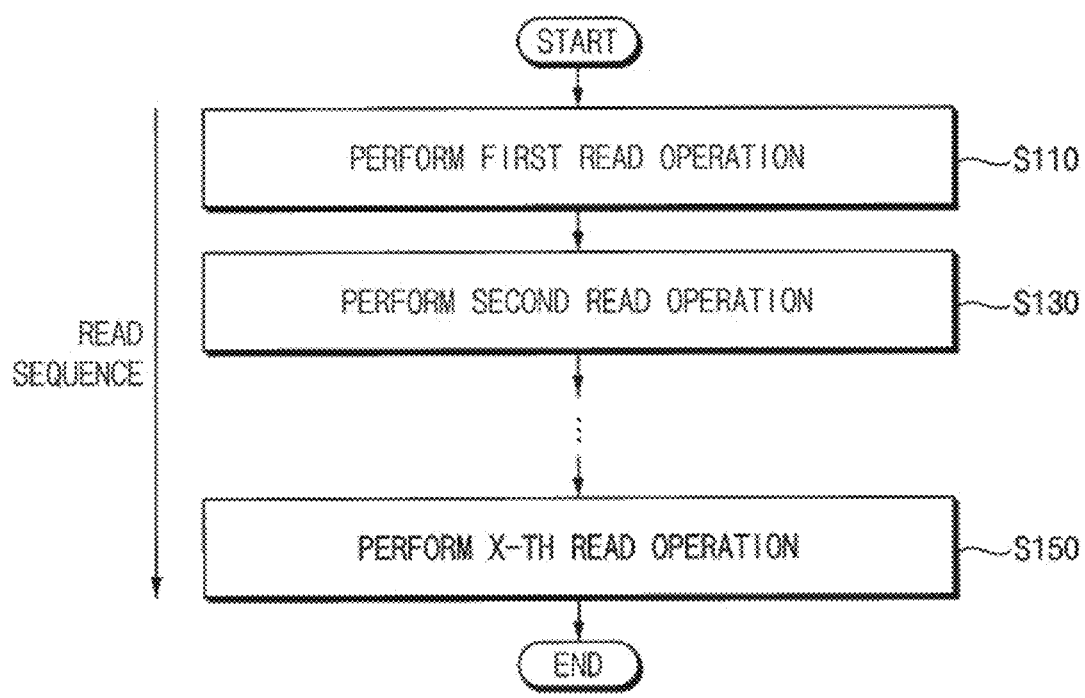
FIGS. 7 and 8 are flowcharts illustrating example embodiments of a plurality of read operations of FIG. 1.
Figure 8:
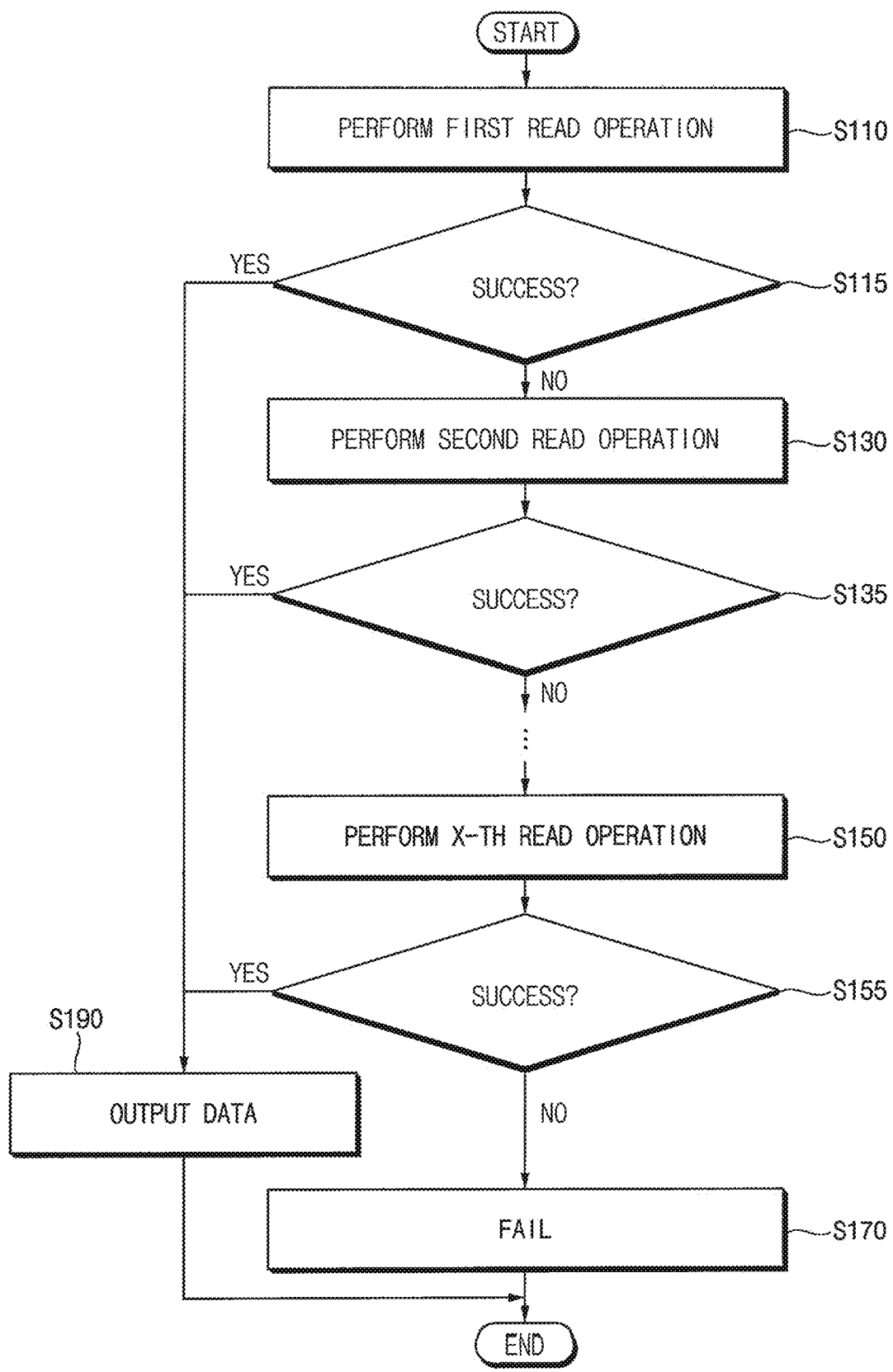

FIGS. 7 and 8 are flowcharts illustrating example embodiments of a plurality of read operations of FIG. 1.

Referring to FIG. 7, a plurality of read operations may be sequentially performed until read data stored in a nonvolatile memory device is successfully retrieved according to step S100 illustrated in FIG. 1. The plurality of read operations may form a read sequence. For example, in the read sequence, a first read operation may be performed (S110), and a second read operation may be performed after the first read operation is finished (S130). A X-th read operation (e.g., X is a natural number greater than or equal to three) may be performed after the second read operation is finished (S150).

According to at least some example embodiments of the inventive concepts, the first to X-th read operations may be performed when the read data stored in the nonvolatile memory device is retrieved, during a typical data I/O process of the nonvolatile memory device. The first to the X-th read operations may correspond to one of the read operations described above with reference to FIG. 3. That is, the first to the X-th read operations may be one of a normal read operation and a recovery read operation.

According to at least some example embodiments of the inventive concepts, the first to the X-th read operations may be sequentially performed, and when it is determined that the K-th read operation among the first to X-th read operation is the success read operation, the (K+1)-th to the X-th read operations after the K-th read operation among the first to X-th read operations may not be performed, where K is a natural number greater than or equal to one and less than or equal to X.

According to at least some example embodiments of the inventive concepts, each of the first to the X-th read operations may have an inherent read latency.

Referring to FIG. 8, a plurality of read operations and a plurality of determination operations may form a read sequence. For example, in the read sequence, a first read operation may be performed (S110), and it may be determined whether the first read operation is successful (S115). When the first read operation fails (S115: NO), a second read operation may be performed (S130), and it may be determined whether the second read operation is successful (S135). When the second read operation fails (S135: NO), a X-th read operation may be performed, e.g., X is three (S150), and it may be determined whether the X-th read operation is successful (S155).

When it is determined that one of the first to the X-th read operations is the success read operation (S115, S135, S155: YES), read data corresponding to the success read operation may be output (S190). On the other hand, when it is determined that none of the first to the X-th read operations are the success read operation, it may be determined that the read sequence is failed (S170).

According to at least some example embodiments of the inventive concepts, in each of the first to the X-th read operations, hard decision data and soft decision data may be generated by using predetermined or, alternatively, desired read level voltage and a plurality of read level voltages around the predetermined or, alternatively, desired read level voltage to read out the read data. An ECC decoding may be performed based on the hard decision data and the soft decision data. The sequence class and the ECC decoding information will be described with reference to FIGS. 12, 13 and 15.

Figure 9:
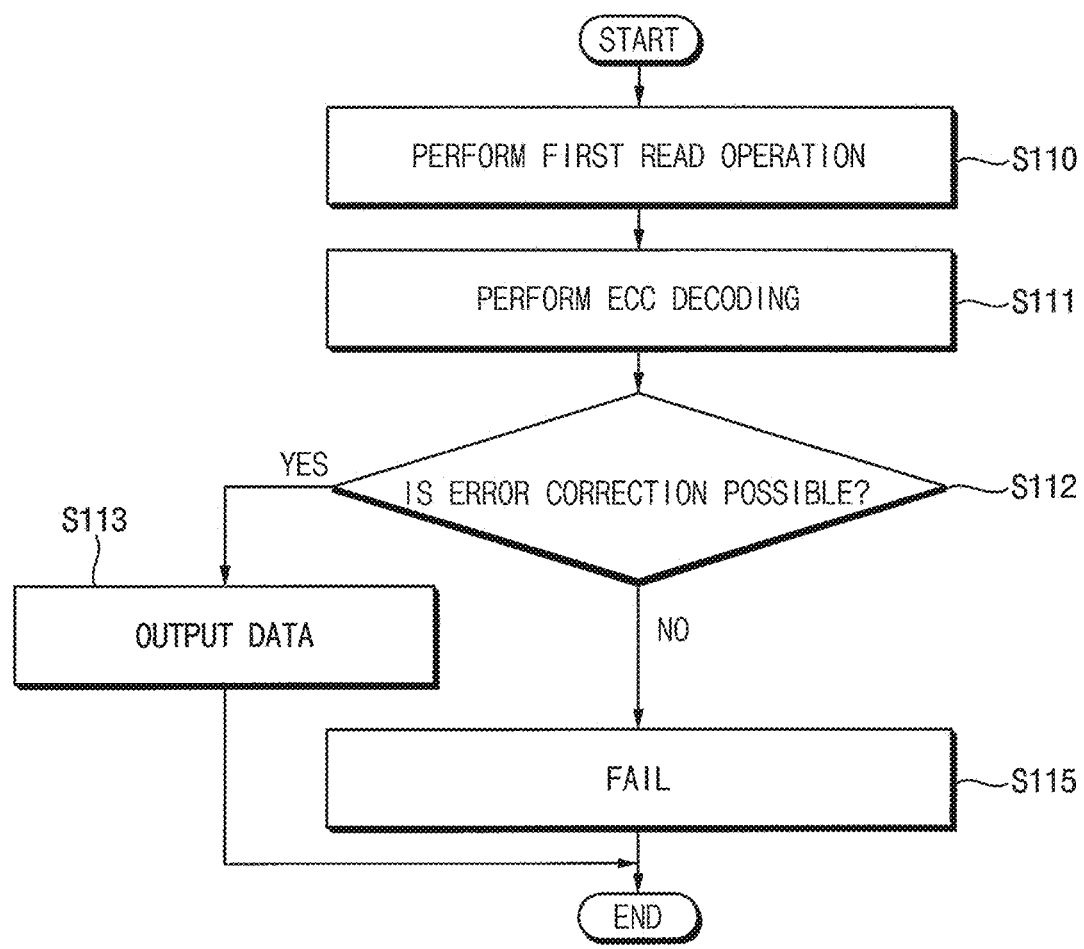
FIGS. 9 and 10 are flowcharts illustrating example embodiments of the plurality of read operations of FIGS. 7 and 8.
Figure 10:
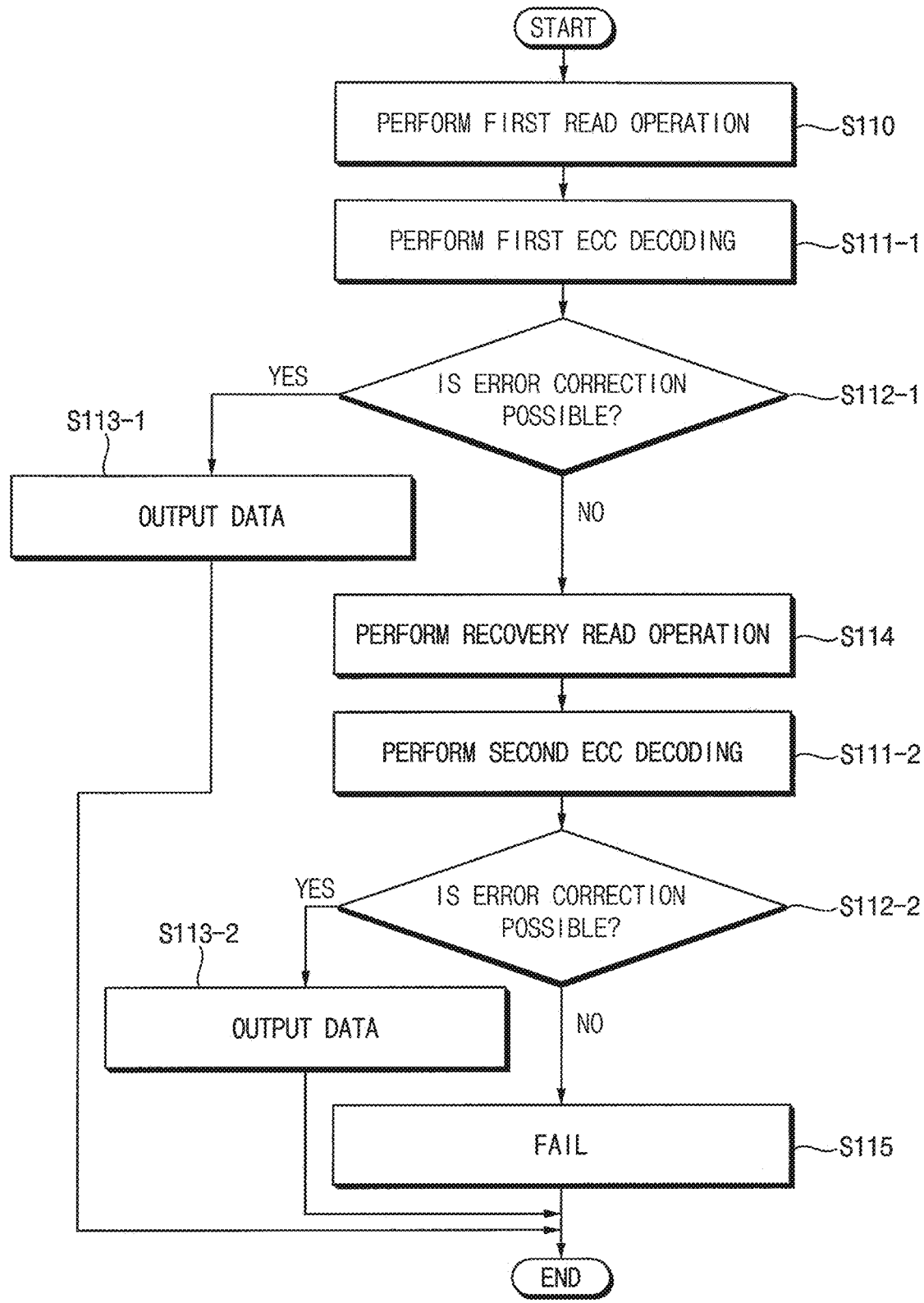

FIGS. 9 and 10 are flowcharts illustrating example embodiments of the plurality of read operations of FIGS. 7 and 8.

In FIGS. 9 and 10, an example of a first read operation among a plurality of read operations is illustrated. However, the present disclosure is not limited thereto. Read operations other than the first read operation may also be configured similarly to the first read operation.

Referring to FIG. 9, the first read operation may be performed (S110), and an ECC decoding may be performed on read data according to the first read operation (S111).

According to at least some example embodiments of the inventive concepts, the ECC decoding may be performed on the read data with an inherent read latency.

It may be determined whether error correction for the read data is possible as a result of the ECC decoding (S112), and when it is determined based on the result of the ECC decoding that error correction for the read data is possible (S112: YES), the error correction for the read data may be performed, and the error corrected read data may be output as valid read data (S113). When it is determined based on the result of the ECC decoding that error correction for the read data is impossible (S112: NO), it may be determined that the first read operation is failed (S115).

For convenience of explanation, in FIG. 9, a plurality of steps S111, S112, S113 and S114 are illustrated to be distinguished from the first read operation S110, however, the plurality of steps S111, S112, S113 and S114 may be included in the first read operation S110. That is, the steps S111, S112, S113 and S114 may organize the first read operation, and may correspond to the S110 described above with reference to FIGS. 7, 8 and 9.

Referring to FIG. 10, steps S110, S111-1, S112-1 and S113-1 may correspond to the steps S110, S111, S112 and S113 described above with reference to FIG. 9. That is, in an example of the first read operation illustrated in FIG. 10, only steps S114, S111-2, S112-2 and S113-2 are further performed.

The first read operation may be performed (S110), and a first ECC decoding may be performed on a first read data according to the first read operation (S111-1).

According to at least some example embodiments of the inventive concepts, the first ECC decoding may be performed on the first read data with an inherent read latency.

It may be determined whether error correction for the first read data is possible as a result of the first ECC decoding (Si 12), and when it is determined based on the result of the first ECC decoding that error correction for the first read data is possible (S112-1: YES), the error correction for the first read data may be performed, and the error corrected first read data may be output as valid read data (S113-1). When it is determined based on the result of the first ECC decoding that error correction for the read data is impossible (S112-1: NO), a recovery read operation in which recovered read data may be retrieved by changing a read level voltage for the first read may be performed (S114), and a second ECC decoding may be performed on the recovered read data retrieved by the recovery read operation (S111-2). When it is determined based on a result of the second ECC decoding that the error correction for the recovered read data is possible (S112-2: YES), the error corrected recovered read data may be output as the valid read data (S113-2). When it is determined based on the result of the second ECC decoding that error correction for the recovered read data is impossible (S112-2: NO), it may be determined that the first read operation is failed (S115).

Figures 11, 12:
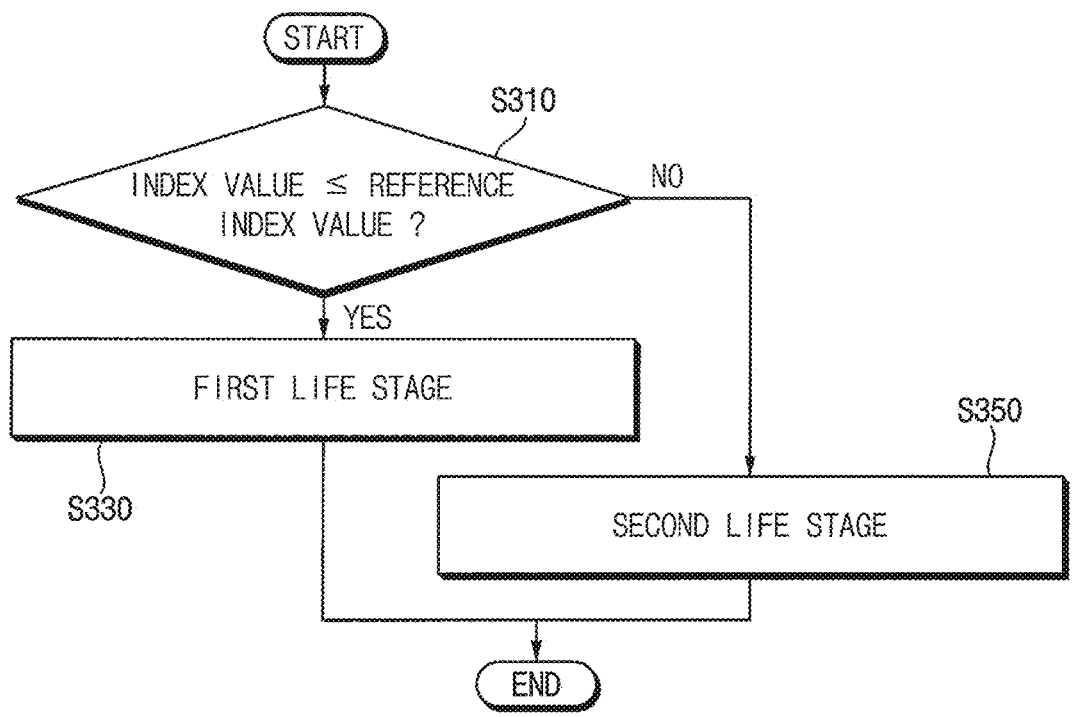

FIG. 11 is a flowchart illustrating an example embodiment of determining a life stage of the nonvolatile memory device of FIG. 1. FIGS. 12 and 13 are diagrams for describing a process of determining the life stage of the nonvolatile memory device of FIG. 11.

Referring to FIG. 11, a life stage of the nonvolatile memory device of FIG. 1 may be determined by or using a sequence class. Specifically, when an index value included in the sequence class is less than or equal to a reference index value (S310: YES), it may be determined that the nonvolatile memory device corresponds to a first life stage (S330). When the index value is greater than the reference index value (S310: NO), it may be determined that the nonvolatile memory device corresponds to a second life stage (S350). Hereinafter, the sequence class will be described.

Referring to FIG. 12, sequence classes SC1, SC2, SC3 and SCX may correspond to read operations (first to X-th read operations), respectively. The sequence classes may be generated in the example of the read sequence described above with reference to FIGS. 8 and 9. For example, the sequence class SC1 may correspond to the first read operation, the sequence class SC2 may correspond to the second read operation, the sequence class SC3 may correspond to the third read operation, and the sequence class SCX may correspond to the X-th read operation.

According to at least some example embodiments of the inventive concepts, each of the sequence classes SC1, SC2, SC3 and SCX may include an index value. For example, the sequence class SC1 may include '1' as the index value, the sequence class SC2 may include '2' as the index value, the sequence class SC3 may include '3' as the index value, and the sequence class SCX may include 'X' as the index value.

According to at least some example embodiments of the inventive concepts, one of the first to the X-th read operation may be the success read operation. An index value included in the sequence class corresponding to the success read operation may be the index value described above with reference to FIG. 1.

Referring to FIG. 13, sequence classes SC1, SC1R, SC2, SC2R, SC3, SC3R, SCX and SCXR may correspond to read operations (first to X-th read operations, first to X-th recovery read operations), respectively. The sequence class may be generated in the example of the read sequence described above with reference to FIGS. 8 and 10. For example, the sequence class SC1 may correspond to the first read operation, and the sequence class SC1R may correspond to the first recovery read operation. The sequence class SC2 may correspond to the second read operation, and the sequence class SC2R may correspond to the second recovery read operation. The sequence class SC3 may correspond to the third read operation, and the sequence class SC3R may correspond to the third recovery read operation. The sequence class SCX may correspond to the X-th read operation, and the sequence class SCXR may correspond to the X-th recovery read operation.

According to at least some example embodiments of the inventive concepts, each of the sequence class SC1, SC1R, SC2, SC2R, SC3, SC3R, SCX and SCXR may include an index value. For example, the sequence class SC1 may include '1' as the index value, and the sequence class SC1R may include '2' as the index value. In a similar manner, sequence classes SC2, SC2R, SC3, SC3R, SCX and SCXR may include '3', '4', '5', '6', '2×−1' and '2×' as the index value, respectively.

According to at least some example embodiments of the inventive concepts, one of the index values ('1' to 'X' in the example illustrated in FIG. 12, '1' to '2×' in the example illustrated in FIG. 13) may be set as the reference index value.

Figure 14:
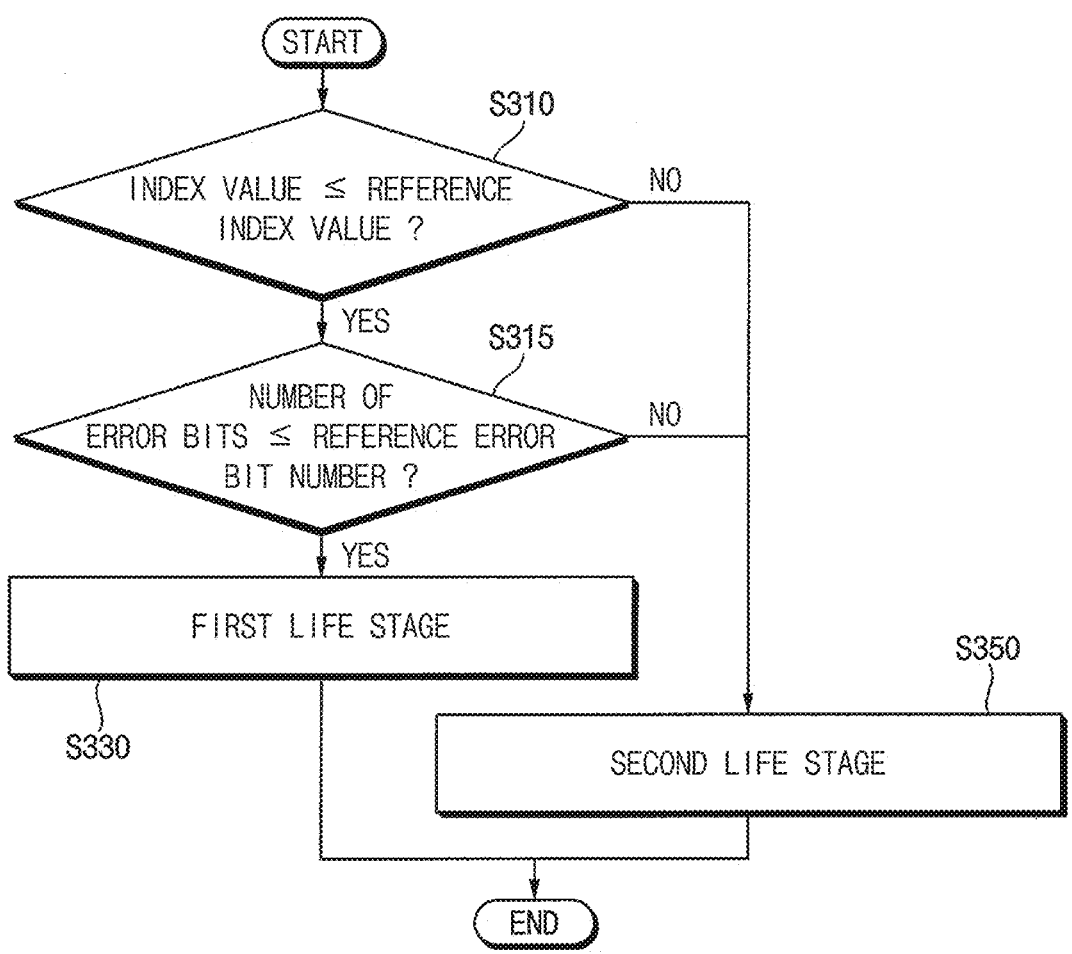
FIG. 14 is a flowchart illustrating an example embodiment of determining a life stage of the nonvolatile memory device of FIG. 1.
Figures 15, 16:
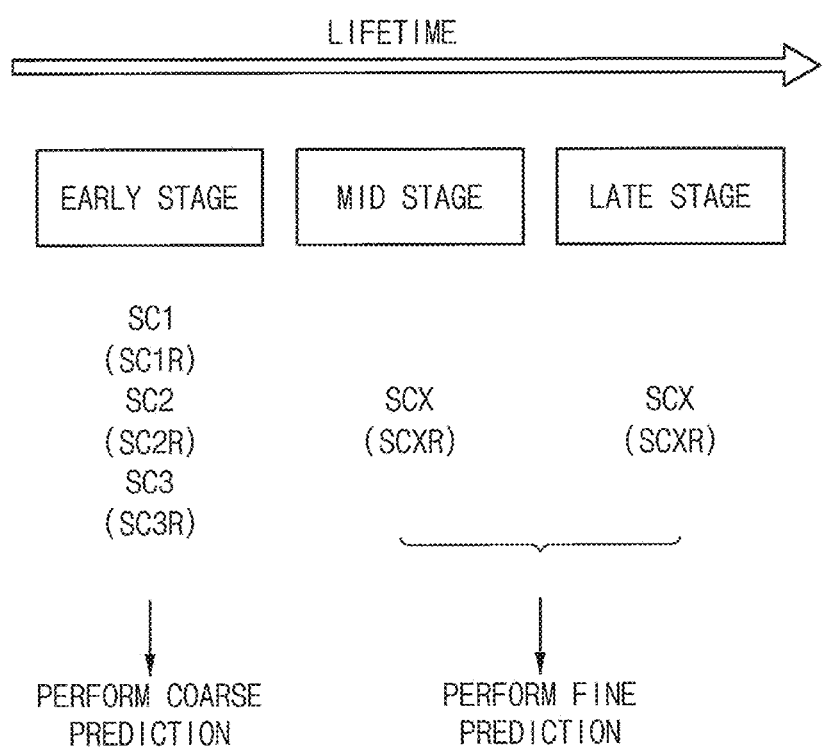
FIG. 15 is a diagram for describing a process of determining the life stage of the nonvolatile memory device of FIG. 14.
FIGS. 16 and 17 are diagrams for describing performing a coarse prediction and performing a fine prediction of the nonvolatile memory device of FIG. 1.

FIG. 14 is a flowchart illustrating an example embodiment of determining a life stage of the nonvolatile memory device of FIG. 1. FIG. 15 is a diagram for describing a process of determining the life stage of the nonvolatile memory device of FIG. 14.

Referring to FIG. 14, a life stage of the nonvolatile memory device of FIG. 1 may be determined by or using a sequence class and ECC decoding information. Specifically, when the index value included in the sequence class is less than or equal to a reference index value (S310: YES) and when the number of the error bits included in the ECC decoding information is less than or equal to a reference error bit number (S315: YES), it may be determined that the nonvolatile memory device corresponds to a first life stage (S330). When the index value is greater than the reference index value (S310: NO) or when the number of the error bits is greater than the reference error bit number (S315: NO), it may be determined that the nonvolatile memory device corresponds to a second life stage (S350). Hereinafter, the ECC decoding information will be described.

Referring to FIG. 15, the ECC decoding information may include the number of error bits that is calculated as a result of performing an ECC decoding on the read data. For example, the ECC decoding information may include the number of the error bits E1 as a result of performing the ECC decoding ECCD1, include the number of the error bits E2 as a result of performing the ECC decoding ECCD2, and include the number of the error bits E3 as a result of performing the ECC decoding DCCD3. The ECC decoding information may include the number of error bits E4, E5 and E6 as a result of performing the ECC decoding ECCD4, ECCD5 and ECCD6, respectively, in a similar manner.

Figure 17:
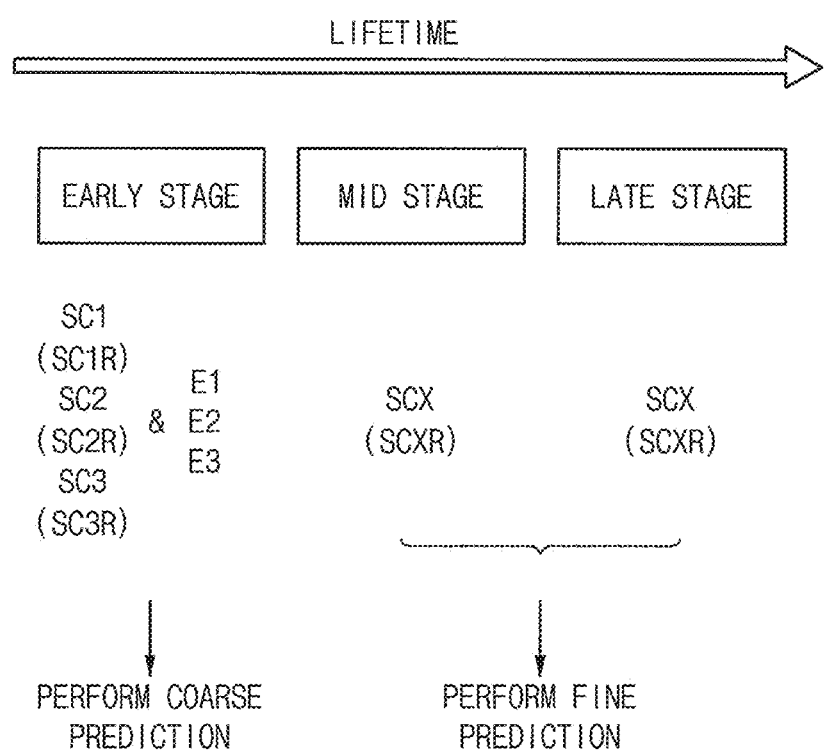

FIGS. 16 and 17 are diagrams for describing performing a coarse prediction and performing a fine prediction of the nonvolatile memory device of FIG. 1.

Referring to FIGS. 1 and 16, when it is determined that a nonvolatile memory device corresponds to a first life stage (e.g., an early stage), a coarse prediction may be performed. When it is determined that the nonvolatile memory device corresponds to a second life stage after the first life stage (e.g., a middle stage or a late stage), a fine prediction may be performed.

According to at least some example embodiments of the inventive concepts, in the example illustrated in FIG. 13, when the reference index value is set to six and when the nonvolatile memory device corresponds to one of sequence classes SC1, SC1R, SC2, SC2R, SC3 and SC3R whose index value is less than or equal to the reference index value, the coarse prediction may be performed to predict a remaining lifetime of the nonvolatile memory device. When the reference index value is set to six and when the nonvolatile memory device corresponds to one of sequence classes SCX and SCXR whose index value is greater than the reference index value, the fine prediction may be performed to predict the remaining lifetime of the nonvolatile memory device.

In this case, the coarse prediction may be performed using the sequence class and the ECC decoding information as input data of an artificial intelligence (AI) model, and the fine prediction may be performed using the sequence class, the ECC decoding information and threshold voltage information as the input data of the AI model.

Further, performing the coarse prediction may include predicting the remaining lifetime of the nonvolatile memory device using the sequence class, the ECC decoding information as the input data of the AI model, and performing the fine prediction may include predicting the remaining lifetime of the nonvolatile memory device using the sequence class, the ECC decoding information and the threshold voltage information as the input data of the AI model.

According to at least some example embodiments of the inventive concepts, the coarse prediction and the fine prediction may include a confidence level of data stored in the nonvolatile memory device. The remaining lifetime of the nonvolatile memory device may include at least one of remaining program/erase (P/E) cycles or a remaining retention time of the nonvolatile memory device.

According to at least some example embodiments of the inventive concepts, when the reference index value is set to six in the example illustrated in FIG. 13, when the reference error bit number is set to three in the example illustrated in FIG. 15, when the nonvolatile memory device corresponds to one of sequence classes SC1, SC1R, SC2, SC2R, SC3 and SC3R whose index value is less than or equal to the reference index value and when the number of the error bits is less than or equal to the reference error bit number (e.g., one of E1, E2 and E3), the coarse prediction may be performed to predict the remaining lifetime of the nonvolatile memory device.

According to at least some example embodiments of the inventive concepts, when the reference index value is set to six, when the reference error bit number is set to three, when the nonvolatile memory device corresponds to one of sequence classes SCX and SCXR whose index values is greater than the reference index value of when the number of the error bits is greater than the reference error bit number, the fine prediction may be performed to predict the remaining lifetime of the nonvolatile memory device.

Figure 18:
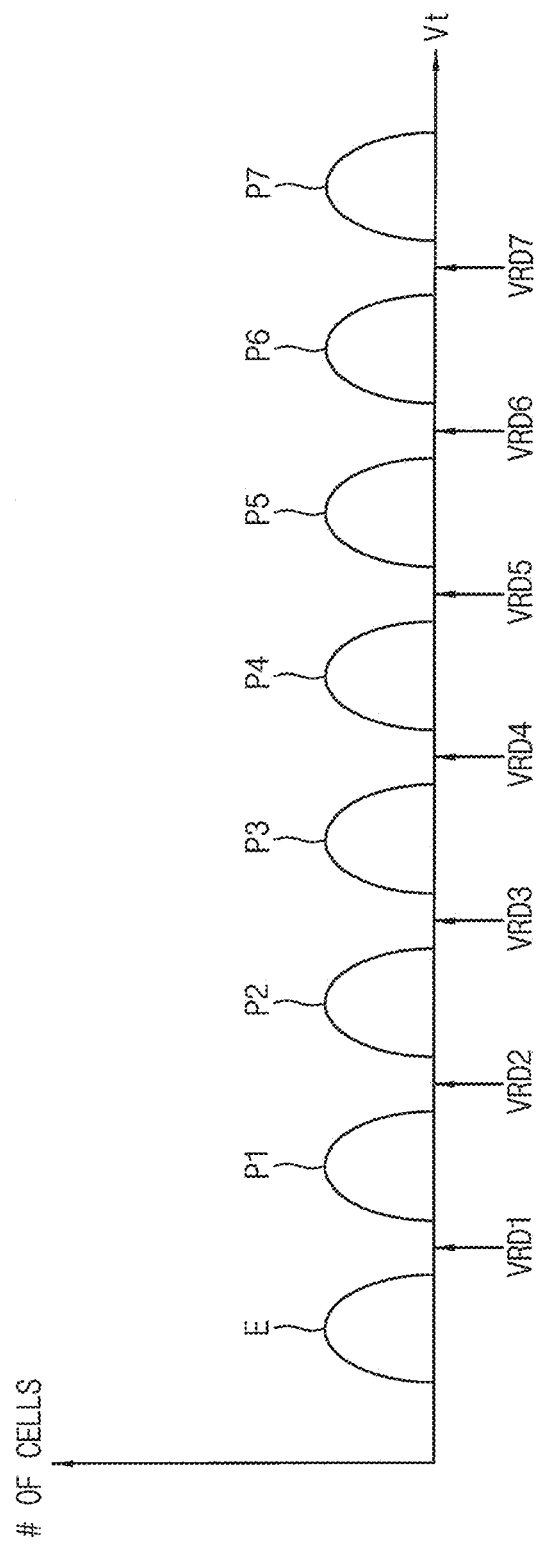
FIGS. 18 and 19 are diagrams for describing threshold voltage information of FIG. 1.
Figure 19:
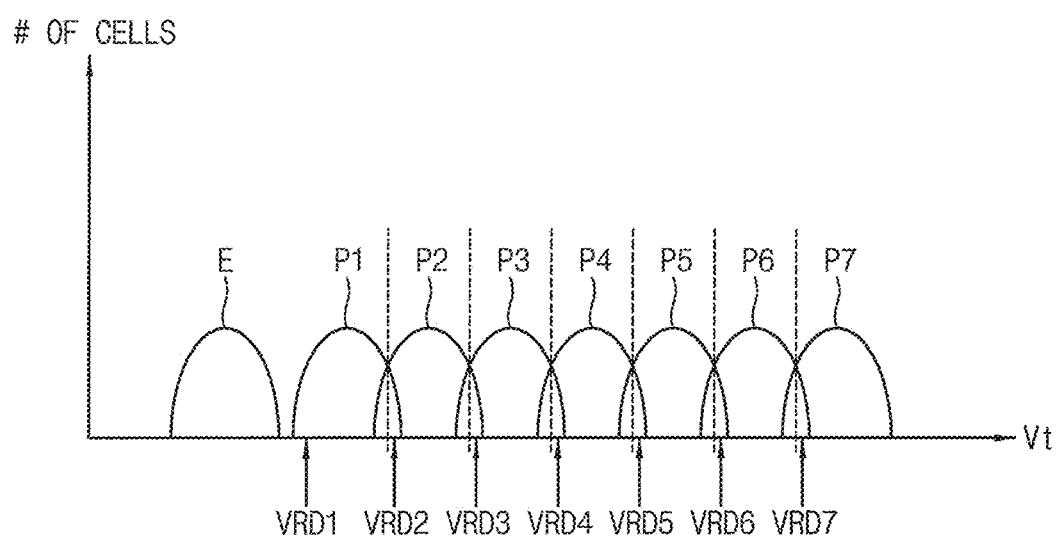

FIGS. 18 and 19 are diagrams for describing threshold voltage information of FIG. 1.

In FIGS. 18 and 19, a threshold voltage distribution of a nonvolatile memory device including memory cells having a triple level cell (TLC) structure is illustrated.

Referring to FIG. 18, memory cells included in the nonvolatile memory device may have an erase state E and one of first to seventh program states P1 to P7.

According to at least some example embodiments of the inventive concepts, read level voltages VRD1 to VRD7 may be predetermined or, alternatively, desired values in consideration of characteristics of the memory cells.

According to at least some example embodiments of the inventive concepts, the read level voltages VRD1 to VRD7 may be determined based on a threshold voltage distribution immediately after the memory cells are programmed. According to at least some example embodiments of the inventive concepts, the read level voltages VRD1 to VRD7 may be determined based on a threshold voltage distribution after a predetermined or, alternatively, desired time has elapsed after the memory cells are programmed (e.g., after the memory cells are stabilized). In this case, the threshold voltage information may be used as input data of an AI model to perform a fine prediction or predict a remaining lifetime of the nonvolatile memory device.

The remaining lifetime of the nonvolatile memory device may include at least one of remaining program/erase (P/E) cycles or a remaining retention time of the nonvolatile memory device.

Further, the remaining lifetime of the nonvolatile memory device may be predicted based on the sequence class, the ECC decoding information, the threshold voltage information and a Self-Monitoring, Analysis and Reporting Technology (SMART) attribute information. The SMART attribute information may include at least one of a reallocated sectors count, a seek error rate, a spin retry count, a reallocation event count and a current pending sectors count. In this case, in the method of predicting a remaining lifetime of a nonvolatile memory device according to at least some example embodiments of the inventive concepts, acquiring the SMART attribute information may be further included. And generating the AI model based on a learning sequence class, learning ECC information and learning threshold voltage information may be further included.

Referring to FIG. 19, when physical characteristics of memory cells included in the nonvolatile memory device are changed due to external factors, the threshold voltage distribution may be changed as illustrated in FIG. 19.

For example, in a charge trap flash (CTF) memory cell, an initial verify shift (IVS) phenomenon may occur in which the threshold voltage distribution of the memory cells decreases as a program time elapses. Further, the threshold voltage distribution of the memory cells may overlap as illustrated in FIG. 19 due to sudden power off (SPO) during programming of the memory cells. Therefore, when reading the read data stored in the nonvolatile memory device based on the read level voltages VRD1 to VRD7, the read data may include a plurality of errors.

Figure 20:
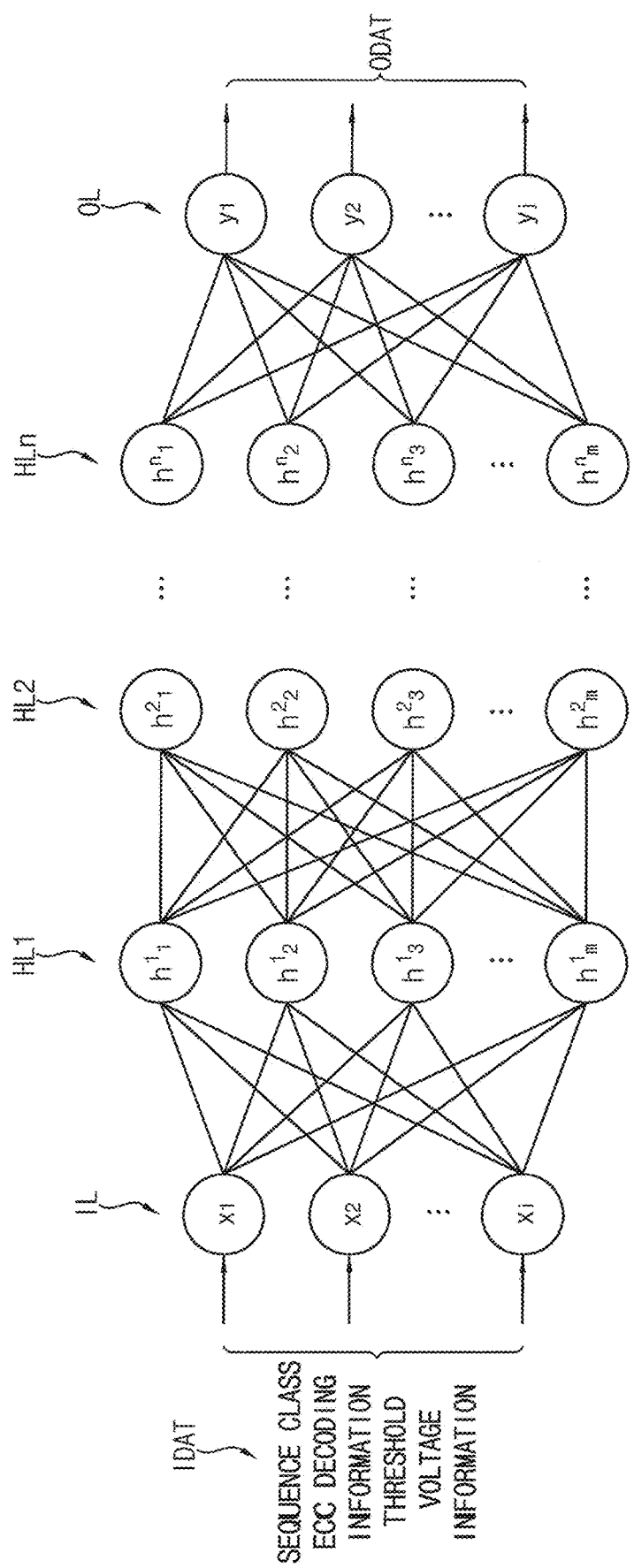
FIGS. 20, 21 and 22 are diagrams illustrating an artificial neural network as an example of an AI model for predicting a remaining lifetime of the nonvolatile memory device of FIG. 1.
Figure 21:
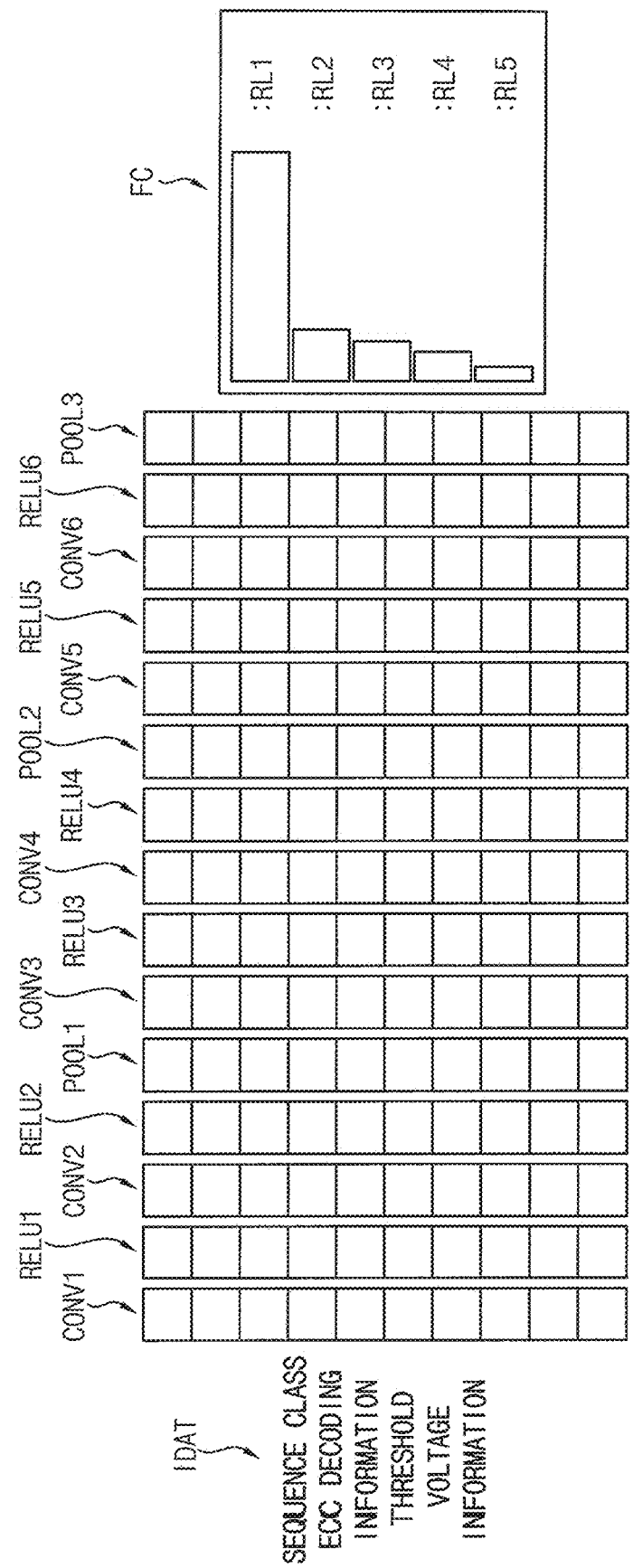
Figure 22:
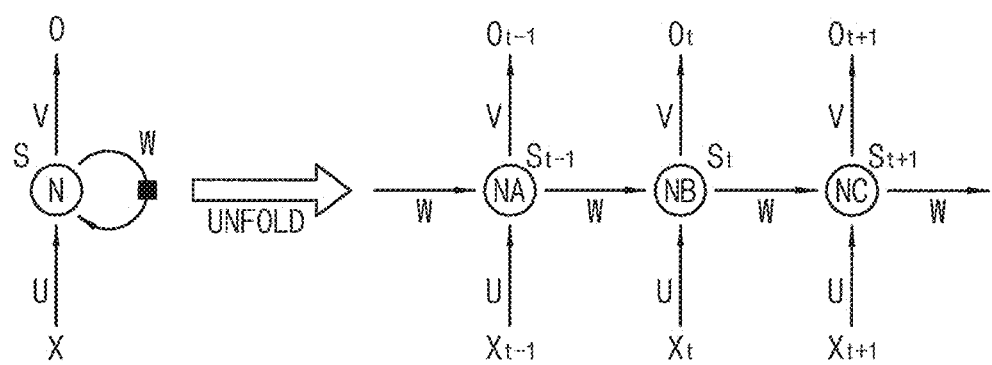

FIGS. 20, 21 and 22 are diagrams illustrating an artificial neural network as an example of an AI model for predicting a remaining lifetime of the nonvolatile memory device of FIG. 1.

Referring to FIG. 20, a general neural network (e.g., an ANN) may include an input layer IL, a plurality of hidden layers HL1, HL2, . . . , HLn and an output layer OL.

The input layer IL may include i input nodes $x_1$, $x_2$, . . . , $x_i$, where i is a natural number. Input data (e.g., vector input data) IDAT whose length is i may be input to the input nodes $x_1$, $x_2$, . . . , $x_i$ such that each element of the input data IDAT is input to a respective one of the input nodes $x_1$, $x_2$, . . . , $x_i$.

The plurality of hidden layers HL1, HL2, HLn may include n hidden layers, where n is a natural number, and may include a plurality of hidden nodes $h^1_1$, $h^1_2$, $h^1_3$, . . . , $h^1_m$, $h^2_1$, $h^2_2$, $h^2_3$, . . . , $h^2_m$, $h^n_1$, $h^n_2$, $h^n_3$, . . . , $h^n_m$. For example, the hidden layer HL1 may include m hidden nodes $h^1_1$, $h^1_2$, $h^1_3$, . . . , $h^1_m$, the hidden layer HL2 may include m hidden nodes $h^2_1$, $h^2_2$, $h^2_3$, . . . , $h^2_m$, and the hidden layer HLn may include m hidden nodes $h^n_1$, $h^n_2$, $h^n_3$, . . . , $h^n_m$, where m is a natural number.

The output layer OL may include j output nodes $y_1$, $y_2$, . . . , $y_j$, where j is a natural number. Each of the output nodes $y_1$, $y_2$, . . . , $y_j$ may correspond to a respective one of classes to be categorized. The output layer OL may output output values (e.g., class scores or simply scores) associated with the input data IDAT for each of the classes. The output layer OL may be referred to as a fully-connected layer and may indicate, for example, a probability that the input data IDAT corresponds to one of candidates of a remaining lifetime of a nonvolatile memory device.

A structure of the neural network illustrated in FIG. 20 may be represented by information on branches (or connections) between nodes illustrated as lines, and a weighted value assigned to each branch, which is not illustrated. Nodes within one layer may not be connected to one another, but nodes of different layers may be fully or partially connected to one another.

Each node (e.g., the node $h^1{}_1$) may receive an output of a previous node (e.g., the node $x_1$), may perform a computing operation, computation or calculation on the received output, and may output a result of the computing operation, computation or calculation as an output to a next node (e.g., the node $h^2{}_1$). Each node may calculate a value to be output by applying the input to a specific function, e.g., a nonlinear function.

Generally, the structure of the neural network is set in advance, and the weighted values for the connections between the nodes are set appropriately using data having an already known answer of which class the data belongs to. The data with the already known answer is referred to as "training data," and a process of determining the weighted value is referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

The general neural network illustrated in FIG. 20 may not be suitable for handling input image data (or input sound data) because each node (e.g., the node $h^1{}_1$) is connected to all nodes of a previous layer (e.g., the nodes $x_1, x_2, \ldots, x_i$ included in the layer IL) and then the number of weighted values drastically increases as the size of the input image data increases. Thus, a CNN, which is implemented by combining the filtering technique with the general neural network, has been researched such that two-dimensional image (e.g., the input image data) is efficiently trained by the CNN.

Referring to FIG. 21, a CNN may include a plurality of layers CONV1, RELU1, CONV2, RELU2, POOL1, CONV3, RELU3, CONV4, RELU4, POOL2, CONV5, RELU5, CONV6, RELU6, POOL3 and FC.

Unlike the general neural network, each layer of the CNN may have three dimensions of width, height and depth, and thus data that is input to each layer may be volume data having three dimensions of width, height and depth. For example, if an input image in FIG. 21 has a size of 32 widths (e.g., 32 pixels) and 32 heights and three color channels R, G and B, input data IDAT corresponding to the input image may have a size of 32*32*3. The input data IDAT in FIG. 21 may be referred to as input volume data or input activation volume.

Each of convolutional layers CONV1, CONV2, CONV3, CONV4, CONV5 and CONV6 may perform a convolutional operation on input volume data. In an image processing, the convolutional operation represents an operation in which image data is processed based on a mask with weighted values and an output value is obtained by multiplying input values by the weighted values and adding up the total multiplied values. The mask may be referred to as a filter, window or kernel.

Particularly, parameters of each convolutional layer may consist of a set of learnable filters. Every filter may be small spatially (along width and height), but may extend through the full depth of an input volume. For example, during the forward pass, each filter may be slid (more precisely, convolved) across the width and height of the input volume, and dot products may be computed between the entries of the filter and the input at any position. As the filter is slid over the width and height of the input volume, a two-dimensional activation map that gives the responses of that filter at every spatial position may be generated. As a result, an output volume may be generated by stacking these activation maps along the depth dimension. For example, if input volume data having a size of 32*32*3 passes through the convolutional layer CONV1 having four filters with zero-padding, output volume data of the convolutional layer CONV1 may have a size of 32*32*12 (e.g., a depth of volume data increases).

Each of RELU layers RELU1, RELU2, RELU3, RELU4, RELU5 and RELU6 may perform a rectified linear unit (RELU) operation that corresponds to an activation function defined by, e.g., a function $\text{fix}(x)=\max(0, x)$ (e.g., an output is zero for all negative input x). For example, if input volume data having a size of 32*32*12 passes through the RELU layer RELU1 to perform the rectified linear unit operation, output volume data of the RELU layer RELU1 may have a size of 32*32*12 (e.g., a size of volume data is maintained).

Each of pooling layers POOL1, POOL2 and POOL3 may perform a down-sampling operation on input volume data along spatial dimensions of width and height. For example, four input values arranged in a 2*2 matrix formation may be converted into one output value based on a 2*2 filter. For example, a maximum value of four input values arranged in a 2*2 matrix formation may be selected based on 2*2 maximum pooling, or an average value of four input values arranged in a 2*2 matrix formation may be obtained based on 2*2 average pooling. For example, if input volume data having a size of 32*32*12 passes through the pooling layer POOL1 having a 2*2 filter, output volume data of the pooling layer POOL1 may have a size of 16*16*12 (e.g., width and height of volume data decreases, and a depth of volume data is maintained).

Typically, one convolutional layer (e.g., CONV1) and one RELU layer (e.g., RELU1) may form a pair of CONV/RELU layers in the CNN, pairs of the CONV/RELU layers may be repeatedly arranged in the CNN, and the pooling layer may be periodically inserted in the CNN, thereby reducing a spatial size of image and extracting a characteristic of image.

An output layer or a fully-connected layer FC may output results (e.g., class scores) of the input volume data IDAT for each of the classes. For example, the input volume data IDAT corresponding to the two-dimensional image may be converted into an one-dimensional matrix or vector as the convolutional operation and the down-sampling operation are repeated. For example, the fully-connected layer FC may represent probabilities that the input volume data IDAT corresponds to a car, a truck, an airplane, a ship and a horse.

The types and number of layers included in the CNN may not be limited to an example described with reference to FIG. 21 and may be changed according to at least some example embodiments of the inventive concepts. In addition, although not illustrated in FIG. 21, the CNN may further include other layers such as a softmax layer for converting score values corresponding to predicted results into probability values, a bias adding layer for adding at least one bias, or the like.

Referring to FIG. 22, a RNN may include a repeating structure using a specific node or cell N illustrated on the left side of FIG. 22.

A structure illustrated on the right side of FIG. 22 may represent that a recurrent connection of the RNN illustrated on the left side is unfolded (or unrolled). The term "unfolded" means that the network is written out or illustrated for the complete or entire sequence including all nodes NA, NB and NC. For example, if the sequence of interest is a sentence of 3 words, the RNN may be unfolded into a 3-layer neural network, one layer for each word (e.g., without recurrent connections or without cycles).

In the RNN in FIG. 22, X represents an input of the RNN. For example, $X_t$ may be an input at time step t, and $X_{t-1}$ and $X_{t+1}$ may be inputs at time steps t−1 and t+1, respectively.

In the RNN in FIG. 22, S represents a hidden state. For example, $S_t$ may be a hidden state at the time step t, and $S_{t-1}$ and $S_{t+1}$ may be hidden states at the time steps t−1 and t+1, respectively. The hidden state may be calculated based on a previous hidden state and an input at a current step. For example, $S_t$=f($UX_t$+$WS_{t-1}$). For example, the function f may be usually a nonlinearity function such as tan h or RELU. $S_{-1}$, which is required to calculate a first hidden state, may be typically initialized to all zeroes.

In the RNN in FIG. 22, O represents an output of the RNN. For example, $O_t$ may be an output at the time step t, and $O_{t-1}$ and $O_{t+1}$ may be outputs at the time steps t−1 and t+1, respectively. For example, if it is required to predict a next word in a sentence, it would be a vector of probabilities across a vocabulary. For example, Ot=softmax(VSt).

In the RNN in FIG. 22, the hidden state may be a "memory" of the network. In other words, the RNN may have a "memory" which captures information about what has been calculated so far. The hidden state St may capture information about what happened in all the previous time steps. The output Ot may be calculated solely based on the memory at the current time step t. In addition, unlike a traditional neural network, which uses different parameters at each layer, the RNN may share the same parameters across all time steps. This may represent the fact that the same task may be performed at each step, just with different inputs. This may greatly reduce the total number of parameters required to be trained or learned.

According to at least some example embodiments of the inventive concepts, various services and/or applications such as a coarse prediction or a fine prediction on a remaining lifetime of a nonvolatile memory device may be executed and processed based on the memory controller described above with reference to FIG. 2 and the storage controller described above with reference to FIG. 6.

Figure 23:
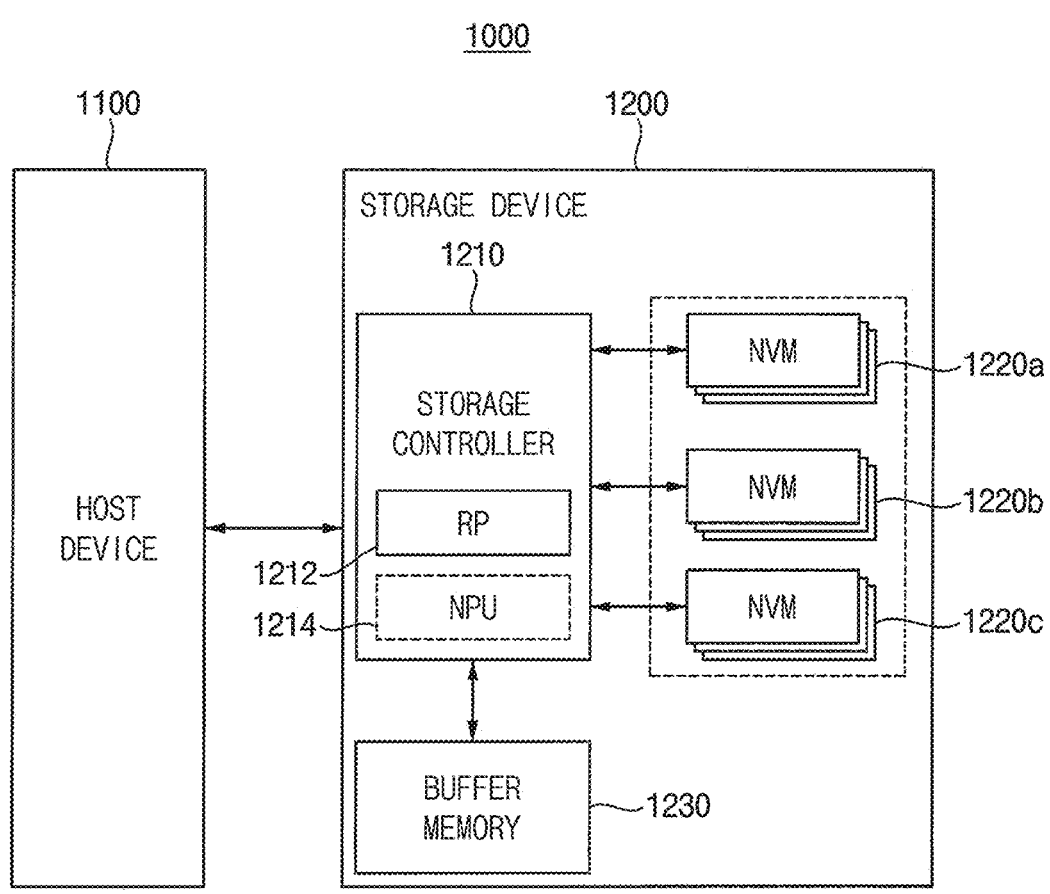
FIG. 23 is a block diagram illustrating a storage device and a storage system including the storage device according to at least some example embodiments of the inventive concepts.

FIG. 23 is a block diagram illustrating a storage device and a storage system including the storage device according to at least some example embodiments of the inventive concepts.

Referring to FIG. 23, a storage system 1000 may include a host device 1100 and a storage device 1200.

The host device 1100 controls overall operations of the storage system 1000. Although not illustrated in FIG. 23, the host device 1100 may include a host processor and a host memory. The host processor may control an operation of the host device 1100. For example, the host processor may execute an operating system (OS). The host memory may store instructions and/or data that are executed and/or processed by the host processor. For example, the operating system executed by the host processor may include a file system for file management and a device driver for controlling peripheral devices including the storage device 1200 at the operating system level.

The storage device 1200 is accessed by the host device 1100. The storage device 1200 includes a storage controller 1210, a plurality of nonvolatile memories (NVMs) 1220a, 1220b and 1220c, and a buffer memory 1230.

The storage controller 1210 may control an operation of the storage device 1200 and/or operations of the plurality of nonvolatile memories 1220a, 1220b and 1220c based on a command and data that are received from the host device 1100. The plurality of nonvolatile memories 1220a, 1220b and 1220c may store a plurality of data. For example, the plurality of nonvolatile memories 1220a, 1220b and 1220c may store meta data, various user data, or the like. The buffer memory 1230 may store instructions and/or data that are executed and/or processed by the storage controller 1210, and may temporarily store data stored in or to be stored into the plurality of nonvolatile memories 1220a, 1220b and 1220c. The storage device 10 of FIG. 2 may be implemented in the form of the storage device 1200. For example, the storage controller 1210 may correspond to the memory controller 20 in FIG. 2, and the nonvolatile memories 1220a, 1220b and 1220c may correspond to the nonvolatile memory device 40 in FIG. 2.

A remaining lifetime predictor (RP) 1212 included in the storage controller 1210 may correspond to the remaining lifetime predictor 430 in FIG. 6. In some example embodiments, the storage controller 1210 may further include a neural processing unit (NPU) 1214 for detecting the I/O pattern of the write data.

In some example embodiments, the storage device 1200 may be a solid state drive (SSD), a universal flash storage (UFS), a multi-media card (MMC) or an embedded multi-media card (eMMC). In other example embodiments, the storage device 1200 may be one of a secure digital (SD) card, a micro SD card, a memory stick, a chip card, a universal serial bus (USB) card, a smart card, a compact flash (CF) card, or the like.

As described above, in the method of predicting a remaining lifetime of a nonvolatile memory device according to at least some example embodiments of the inventive concepts, as described above, by performing the steps S100, S200, S300, S400 and S500, the remaining lifetime of the nonvolatile memory device may be efficiently determined. When it is determined that the nonvolatile memory device corresponds to a first life stage, a coarse prediction is only performed, and when it is determined that the nonvolatile memory device corresponds to a second life stage after the first life stage, a fine prediction is performed more precisely than the coarse prediction. That is, by adaptively performing different predictions according to life stages of the nonvolatile memory device, a speed and an accuracy of the predictions may be improved.

At least some example embodiments of the inventive concepts may be applied to various electronic devices and systems that include the nonvolatile memory devices and the storage devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A method of predicting a remaining lifetime of a nonvolatile memory device, the method comprising:
performing one or more read operations, iteratively, until read data stored in the nonvolatile memory device is successfully retrieved;
generating a sequence class and error correction code (ECC) decoding information, the sequence class corresponding to a success read operation, the success read operation being a read operation, from among the one or more read operations, based upon which the read data is successfully retrieved;
determining a life stage of the nonvolatile memory device based on at least one of the sequence class and the ECC decoding information;
in response to determining that the nonvolatile memory device corresponds to a first life stage, performing a coarse prediction on the remaining lifetime of the nonvolatile memory device based on the sequence class and the ECC decoding information; and
in response to determining that the nonvolatile memory device corresponds to a second life stage after the first life stage, performing a fine prediction on the remaining lifetime of the nonvolatile memory device based on the sequence class, the ECC decoding information and threshold voltage information of the nonvolatile memory device.

2. The method of claim 1, wherein:
the sequence class includes an index value corresponding to the success read operation,
the ECC decoding information includes a number of error bits that is calculated as a result of performing an ECC decoding on the read data, and
the threshold voltage information includes difference values between a first threshold voltage distribution and a second threshold voltage distribution, the first threshold voltage distribution being measured immediately after the read data is programmed into memory cells included in the nonvolatile memory device, the second threshold voltage distribution being measured immediately after the read data is successfully retrieved.

3. The method of claim 2, wherein determining the life stage of the nonvolatile memory device comprises:
in response to the index value being less than or equal to a reference index value, determining that the nonvolatile memory device corresponds to the first life stage; and
in response to the index value being greater than the reference index value, determining that the nonvolatile memory device corresponds to the second life stage.

4. The method of claim 2, wherein determining the life stage of the nonvolatile memory device comprises:
in response to determining the index value is less than or equal to a reference index value and the number of the error bits is less than or equal to a reference error bit number,
determining that the nonvolatile memory device corresponds to the first life stage; and
in response to determining the index value is greater than the reference index value or determining the number of the error bits is greater than the reference error bit number,
determining that the nonvolatile memory device corresponds to the second life stage.

5. The method of claim 1,
wherein performing the coarse prediction comprises:
performing the coarse prediction using the sequence class and the ECC decoding information as input data of an artificial intelligence (AI) model, and
wherein performing the fine prediction comprises:
performing the fine prediction using the sequence class, the ECC decoding information and the threshold voltage information as the input data of the AI model.

6. The method of claim 5,
wherein performing the coarse prediction further comprises:
predicting the remaining lifetime of the nonvolatile memory device using the sequence class, the ECC decoding information as the input data of the AI model, and
wherein performing the fine prediction further comprises:
predicting the remaining lifetime of the nonvolatile memory device using the sequence class, the ECC decoding information and the threshold voltage information as the input data of the AI model.

7. The method of claim 6, wherein the remaining lifetime of the nonvolatile memory device includes at least one of remaining program/erase (P/E) cycles and a remaining retention time of the nonvolatile memory device.

8. The method of claim 6, further comprising:
acquiring Self-Monitoring, Analysis and Reporting Technology (SMART) attribute information including at least one of a reallocated sectors count, a seek error rate, a spin retry count, a reallocation event count and a current pending sectors count,
wherein the remaining lifetime of the nonvolatile memory device is predicted based on the sequence class, the ECC decoding information, the threshold voltage information and the SMART attribute information.

9. The method of claim 6, further comprising:
generating the AI model based on a learning sequence class, learning ECC information and learning threshold voltage information.

10. The method of claim 1, wherein,
the one or more read operations includes a plurality of read operations,
the plurality of read operations include first to X-th read operations that are sequentially performed, where X is a natural number greater than or equal to two, and in response to determining that a K-th read operation among the first to the X-th read operations is the success read operation, the (K+1)-th to the X-th read operations after the K-th read operation among the first to the X-th read operations are not performed, where K is a natural number greater than or equal to one and less than or equal to X.

11. The method of claim 10, wherein,
in each of the first to the X-th read operations, ECC decoding is performed on the read data with an inherent read latency, and
in response to determining,
based on a result of the ECC decoding, that error correction for the read data is possible,
performing the error correction for the read data, and outputting the error corrected read data as valid read data.

12. The method of claim 10, wherein,
each of the first to the X-th read operations include,
generating hard decision data and soft decision data using first read level voltages to retrieve the read data, and
performing the ECC decoding based on the hard decision data and the soft decision data.

13. The method of claim 10, wherein,
in each of the first to the X-th read operations, a first ECC decoding is performed on the read data with an inherent read latency,
in response to determining, based on a result of the first ECC decoding, that error correction for the read data is impossible,
performing a recovery read operation in which recovered read data is retrieved by changing a read level voltage for the read data is performed, and
performing a second ECC decoding on the recovered read data retrieved by the recovery read operation, and
in response to determining, based on a result of the second ECC decoding, that the error correction for the recovered read data is possible,
generating error-corrected recovered read data by performing the error correction for the read data, and
outputting the error-corrected recovered read data as valid read data.

14. The method of claim 1, wherein:
in response to a time point at which the life stage of the nonvolatile memory device is determined exceeding a predetermined time from a time point at which the nonvolatile memory device is manufactured,
omitting the performing the coarse prediction, and
performing the fine prediction.

15. A storage device comprising:
a nonvolatile memory device; and
a storage controller processor configured to control the nonvolatile memory device,
wherein the storage controller processor is further configured to,
perform one or more read operations, iteratively, until read data stored in the nonvolatile memory device is successfully retrieved,
generate a sequence class and error correction code (ECC) decoding information, the sequence class corresponding to a success read operation, the success read operation being a read operation, from among the one or more read operations, based upon which the read data is successfully retrieved,
determine a life stage of the nonvolatile memory device based on at least one of the sequence class and the ECC decoding information,
in response to determining that the nonvolatile memory device corresponds to a first life stage, perform a coarse prediction on a remaining lifetime of the nonvolatile memory device based on the sequence class and the ECC decoding information, and
in response to determining that the nonvolatile memory device corresponds to a second life stage after the first life stage, perform a fine prediction on the remaining lifetime of the nonvolatile memory device based on the sequence class, the ECC decoding information and threshold voltage information of the nonvolatile memory device.

16. The storage device of claim 15,
wherein the storage controller processor is further configured to,
perform the coarse prediction using the sequence class and the ECC decoding information as input data of an artificial intelligence (AI) model, and
perform the fine prediction using the sequence class, the ECC decoding information and the threshold voltage information as the input data of the AI model.

17. The storage device of claim 15, wherein,
the sequence class includes an index value corresponding to the success read operation,
the ECC decoding information includes a number of error bits that is calculated as a result of performing an ECC decoding on the read data, and
the threshold voltage information includes difference values between a first threshold voltage distribution and a second threshold voltage distribution, the first threshold voltage distribution being a voltage distribution measured immediately after the read data is programmed into memory cells included in the nonvolatile memory device, the second threshold voltage distribution being a threshold voltage distribution measured immediately after the read data is successfully retrieved.

18. The storage device of claim 17, wherein:
the storage controller processor is further configured to,
in response to determining the index value is less than or equal to a reference index value, determine that the nonvolatile memory device corresponds to an early stage,
in response to determining the index value is greater than the reference index value, determine that the nonvolatile memory device corresponds to one of a middle stage and a late stage.

19. The storage device of claim 17, wherein:
the storage controller processor is further configured to,
in response to determining that the index value is less than or equal to a reference index value and the number of error bits is less than or equal to a reference error bit number, determine that the nonvolatile memory device corresponds to an early stage, and
in response to determining that the index value is greater than the reference index value or that the number of the error bits is greater than the reference error bit number, determine that the nonvolatile memory device corresponds to one of a middle stage and a late stage.

20. A method of predicting a remaining lifetime of a nonvolatile memory device, the method comprising:
performing one or more read operations, iteratively, until read data stored in the nonvolatile memory device is successfully retrieved;
generating a sequence class and error correction code (ECC) decoding information, the sequence class corresponding to a success read operation, the success read operation being a read operation, from among the one or more read operations, based upon which the read data is successfully retrieved;
determining a life stage of the nonvolatile memory device based on at least one of the sequence class and the ECC decoding information;
in response to determining that the nonvolatile memory device corresponds to a first life stage, performing a coarse prediction on the remaining lifetime of the nonvolatile memory device based on the sequence class and the ECC decoding information; and in response to determining that the nonvolatile memory device corresponds to a second life stage after the first life stage, performing a fine prediction on the remaining lifetime of the nonvolatile memory device based on the sequence class, the ECC decoding information and threshold voltage information of the nonvolatile memory device, wherein the sequence class includes an index value corresponding to the success read operation, wherein determining the life stage of the nonvolatile memory device includes,
in response to determining that the index value is less than or equal to a reference index value, determining that the nonvolatile memory device corresponds to the first life stage, wherein performing the coarse prediction includes,
performing the coarse prediction using the sequence class and the ECC decoding information as input data of an artificial intelligence (AI) model; and
predicting the remaining lifetime of the nonvolatile memory device using the sequence class, the ECC decoding information as the input data of the AI model, and wherein the remaining lifetime of the nonvolatile memory device includes at least one of remaining program/erase (P/E) cycles and a remaining retention time of the nonvolatile memory device.

\* \* \* \* \*